United States Patent
Chemel et al.

(10) Patent No.: US 7,354,172 B2
(45) Date of Patent: Apr. 8, 2008

(54) METHODS AND APPARATUS FOR CONTROLLED LIGHTING BASED ON A REFERENCE GAMUT

(75) Inventors: Brian Chemel, Marblehead, MA (US); Frederick M. Morgan, Quincy, MA (US); Kevin J. Dowling, Westford, MA (US)

(73) Assignee: Philips Solid-State Lighting Solutions, Inc., Burlington, MA (US)

( * ) Notice: Subject to any disclaimer, the term of this patent is extended or adjusted under 35 U.S.C. 154(b) by 0 days.

(21) Appl. No.: 11/312,205

(22) Filed: Dec. 20, 2005

(65) Prior Publication Data

US 2006/0104058 A1 May 18, 2006

Related U.S. Application Data

(63) Continuation-in-part of application No. 11/081,020, filed on Mar. 15, 2005.

(60) Provisional application No. 60/637,554, filed on Dec. 20, 2004, provisional application No. 60/553,111, filed on Mar. 15, 2004.

(51) Int. Cl.
*F21V 9/00* (2006.01)
(52) U.S. Cl. .................................... 362/231
(58) Field of Classification Search ................. 362/231
See application file for complete search history.

(56) References Cited

U.S. PATENT DOCUMENTS

| | | |
|---|---|---|
| 4,420,711 A | 12/1983 | Takahashi et al. |
| 4,622,881 A | 11/1986 | Rand |
| 4,625,152 A | 11/1986 | Nakai |
| 4,635,052 A | 1/1987 | Aoike et al. |

(Continued)

FOREIGN PATENT DOCUMENTS

AU 96/62679 12/1996

(Continued)

OTHER PUBLICATIONS

LM117/LM317A/LM317 "3-Terminal Adjustable Regulator," National Semiconductor Corporation, May 1997, pp. 1-20.

(Continued)

*Primary Examiner*—Ali Alavi
*Assistant Examiner*—William J Carter
(74) *Attorney, Agent, or Firm*—Wolf, Greenfield & Sacks, P.C.

(57) ABSTRACT

Methods and apparatus for controlled lighting based on a reference color gamut that is shared amongst multiple lighting units. A reference color gamut may be determined for multiple lighting units based on spectral power distributions associated with the lighting units. Variable color light or variable color temperature white light subsequently may be generated consistently and predictably amongst multiple lighting units that are each controlled based on the reference color gamut. Lighting commands received by multiple lighting units may be appropriately processed in each lighting unit, based on a predetermined relationship between the lighting commands and the reference color gamut, to ensure consistent and predictable color or color temperature reproduction amongst the multiple units. In one exemplary implementation, the multiple lighting units include LED light sources to facilitate energy efficient generation and versatile control of variable color light or variable color temperature white light, for general purpose illumination and other applications.

40 Claims, 13 Drawing Sheets

U.S. PATENT DOCUMENTS

| | | |
|---|---|---|
| 4,727,289 A | 2/1988 | Uchida |
| 4,753,148 A | 6/1988 | Johnson |
| 4,771,274 A | 9/1988 | Havel |
| 4,837,565 A | 6/1989 | White |
| 4,843,627 A | 6/1989 | Stebbins |
| 4,845,481 A | 7/1989 | Havel |
| 4,887,074 A | 12/1989 | Simon et al. |
| 4,934,852 A | 6/1990 | Havel |
| 4,962,687 A | 10/1990 | Belliveau et al. |
| 5,008,595 A | 4/1991 | Kazar |
| 5,010,459 A | 4/1991 | Taylor et al. |
| 5,078,039 A | 1/1992 | Tulk et al. |
| 5,194,854 A | 3/1993 | Havel |
| 5,209,560 A | 5/1993 | Taylor et al. |
| 5,282,121 A | 1/1994 | Bornhorst et al. |
| 5,294,865 A | 3/1994 | Haraden |
| 5,307,295 A | 4/1994 | Taylor et al. |
| 5,329,431 A | 7/1994 | Taylor et al. |
| 5,350,977 A | 9/1994 | Hamamoto et al. |
| 5,357,170 A | 10/1994 | Luchaco et al. |
| 5,374,876 A | 12/1994 | Horibata et al. |
| 5,388,357 A | 2/1995 | Malita |
| 5,402,702 A | 4/1995 | Hata |
| 5,404,282 A | 4/1995 | Klinke et al. |
| 5,406,176 A | 4/1995 | Sugden |
| 5,410,328 A | 4/1995 | Yoksza et al. |
| 5,420,482 A | 5/1995 | Phares |
| 5,436,535 A | 7/1995 | Yang |
| 5,461,188 A | 10/1995 | Drago et al. |
| 5,463,280 A | 10/1995 | Johnson |
| 5,489,771 A | 2/1996 | Beach et al. |
| 5,493,183 A | 2/1996 | Kimball |
| 5,504,395 A | 4/1996 | Johnson et al. |
| 5,521,708 A | 5/1996 | Beretta |
| 5,532,848 A | 7/1996 | Beretta |
| 5,545,950 A | 8/1996 | Cho |
| 5,561,346 A | 10/1996 | Byrne |
| 5,575,459 A | 11/1996 | Anderson |
| 5,592,051 A | 1/1997 | Korkala |
| 5,633,629 A | 5/1997 | Hochstein |
| 5,642,129 A | 6/1997 | Zavracky et al. |
| 5,673,059 A | 9/1997 | Zavracky et al. |
| 5,684,309 A | 11/1997 | McIntosh et al. |
| 5,734,590 A | 3/1998 | Tebbe |
| 5,751,118 A | 5/1998 | Mortimer |
| 5,769,527 A | 6/1998 | Taylor et al. |
| 5,809,213 A | 9/1998 | Bhattacharjya |
| 5,821,695 A | 10/1998 | Vilanilam et al. |
| 5,831,686 A | 11/1998 | Beretta |
| 5,850,126 A | 12/1998 | Kanbar |
| 5,851,063 A | 12/1998 | Doughty et al. |
| 5,896,010 A | 4/1999 | Mikolajczak et al. |
| 5,961,201 A | 10/1999 | Gismondi |
| 5,982,957 A | 11/1999 | DeCaro et al. |
| 6,008,783 A | 12/1999 | Kitagawa et al. |
| 6,016,038 A | 1/2000 | Mueller et al. |
| 6,025,550 A | 2/2000 | Kato |
| 6,031,343 A | 2/2000 | Recknagel et al. |
| 6,068,383 A | 5/2000 | Robertson et al. |
| 6,072,280 A | 6/2000 | Allen |
| 6,078,732 A | 6/2000 | Beretta |
| 6,097,352 A | 8/2000 | Zavracky et al. |
| 6,127,783 A | 10/2000 | Pashley et al. |
| 6,150,774 A | 11/2000 | Mueller et al. |
| 6,166,496 A | 12/2000 | Lys et al. |
| 6,211,626 B1 | 4/2001 | Lys et al. |
| 6,292,901 B1 | 9/2001 | Lys et al. |
| 6,329,764 B1 | 12/2001 | van de Ven |
| 6,330,111 B1 | 12/2001 | Myers |
| 6,331,915 B1 | 12/2001 | Myers |
| 6,340,868 B1 | 1/2002 | Lys et al. |
| 6,414,756 B1 * | 7/2002 | Tsukada ..................... 358/1.9 |
| 6,441,558 B1 | 8/2002 | Muthu et al. |
| 6,459,919 B1 | 10/2002 | Lys et al. |
| 6,495,964 B1 | 12/2002 | Muthu et al. |
| 6,528,954 B1 | 3/2003 | Lys et al. |
| 6,548,967 B1 | 4/2003 | Dowling et al. |
| 6,577,080 B2 | 6/2003 | Lys et al. |
| 6,608,453 B2 | 8/2003 | Morgan et al. |
| 6,608,614 B1 | 8/2003 | Johnson |
| 6,624,597 B2 | 9/2003 | Dowling et al. |
| 6,717,376 B2 | 4/2004 | Lys et al. |
| 6,720,745 B2 | 4/2004 | Mueller et al. |
| 6,741,351 B2 | 5/2004 | Marshall et al. |
| 6,774,584 B2 | 8/2004 | Lys et al. |
| 6,777,891 B2 | 8/2004 | Lys et al. |
| 6,781,329 B2 | 8/2004 | Morgan et al. |
| 6,788,011 B2 | 9/2004 | Mueller et al. |
| 6,801,003 B2 | 10/2004 | Schanberger et al. |
| 6,806,659 B1 | 10/2004 | Mueller et al. |
| 6,869,204 B2 | 3/2005 | Morgan et al. |
| 6,883,929 B2 | 4/2005 | Dowling |
| 6,888,322 B2 | 5/2005 | Dowling et al. |
| 6,897,624 B2 | 5/2005 | Ducharme et al. |
| 6,936,978 B2 | 8/2005 | Morgan et al. |
| 6,965,205 B2 | 11/2005 | Piepgras et al. |
| 6,967,448 B2 | 11/2005 | Morgan et al. |
| 6,969,954 B2 | 11/2005 | Lys |
| 6,975,079 B2 | 12/2005 | Lys et al. |
| 6,992,803 B2 | 1/2006 | Chang |
| 7,027,015 B2 | 4/2006 | Booth, Jr. et al. |
| 7,067,985 B2 | 6/2006 | Adachi |
| 7,067,995 B2 | 6/2006 | Gunter et al. |
| 7,173,384 B2 | 2/2007 | Plötz et al. |
| 2002/0038157 A1 | 3/2002 | Dowling et al. |
| 2002/0044066 A1 | 4/2002 | Dowling et al. |
| 2002/0048169 A1 | 4/2002 | Dowling et al. |
| 2002/0070688 A1 | 6/2002 | Dowling et al. |
| 2002/0074559 A1 | 6/2002 | Dowling et al. |
| 2002/0078221 A1 | 6/2002 | Blackwell et al. |
| 2002/0130627 A1 | 9/2002 | Dowling et al. |
| 2002/0145394 A1 | 10/2002 | Morgan et al. |
| 2002/0145869 A1 | 10/2002 | Dowling |
| 2002/0152045 A1 | 10/2002 | Dowling et al. |
| 2002/0158583 A1 | 10/2002 | Lys et al. |
| 2002/0176259 A1 | 11/2002 | Ducharme |
| 2003/0011538 A1 | 1/2003 | Lys et al. |
| 2003/0028260 A1 | 2/2003 | Blackwell |
| 2003/0057884 A1 | 3/2003 | Dowling et al. |
| 2003/0057887 A1 | 3/2003 | Dowling et al. |
| 2003/0076281 A1 | 4/2003 | Morgan et al. |
| 2003/0100837 A1 | 5/2003 | Lys et al. |
| 2003/0133292 A1 | 7/2003 | Mueller et al. |
| 2003/0137849 A1 * | 7/2003 | Alden ........................ 362/466 |
| 2003/0214817 A1 * | 11/2003 | Hacker ...................... 362/555 |
| 2003/0222587 A1 | 12/2003 | Dowling et al. |
| 2004/0036006 A1 | 2/2004 | Dowling |
| 2004/0052076 A1 | 3/2004 | Mueller et al. |
| 2004/0066652 A1 | 4/2004 | Hong |
| 2004/0090191 A1 | 5/2004 | Mueller et al. |
| 2004/0090787 A1 | 5/2004 | Dowling et al. |
| 2004/0105261 A1 | 6/2004 | Ducharme et al. |
| 2004/0105264 A1 * | 6/2004 | Spero ......................... 362/234 |
| 2004/0113568 A1 | 6/2004 | Dowling et al. |
| 2004/0116039 A1 | 6/2004 | Mueller et al. |
| 2004/0130909 A1 | 7/2004 | Mueller et al. |
| 2004/0178751 A1 | 9/2004 | Mueller et al. |
| 2004/0212320 A1 | 10/2004 | Dowling et al. |
| 2004/0212321 A1 | 10/2004 | Lys et al. |
| 2004/0212993 A1 | 10/2004 | Morgan et al. |
| 2005/0099824 A1 | 5/2005 | Dowling et al. |
| 2005/0116667 A1 | 6/2005 | Mueller et al. |
| 2005/0151489 A1 | 7/2005 | Lys et al. |
| 2005/0174309 A1 | 8/2005 | Bouwens et al. |

| | | | | | | |
|---|---|---|---|---|---|---|
| 2005/0200578 | A1* | 9/2005 | Lee et al. .............. 345/82 | FR | 2640791 | 6/1990 |
| 2005/0213352 | A1 | 9/2005 | Lys et al. | GB | 2045098 A | 10/1980 |
| 2005/0213353 | A1 | 9/2005 | Lys | GB | 2135536 A | 8/1984 |
| 2005/0218838 | A1 | 10/2005 | Lys | GB | 2176042 A | 12/1986 |
| 2005/0218870 | A1 | 10/2005 | Lys | JP | 06043830 | 2/1994 |
| 2005/0219872 | A1 | 10/2005 | Lys | JP | 0720711 | 1/1995 |
| 2005/0231133 | A1 | 10/2005 | Lys | JP | 9320766 | 12/1997 |
| 2005/0236029 | A1 | 10/2005 | Dowling | WO | WO89/05086 | 6/1989 |
| 2005/0236998 | A1 | 10/2005 | Mueller | WO | WO94/18809 | 8/1994 |
| 2005/0253533 | A1 | 11/2005 | Lys et al. | WO | WO95/13498 | 5/1995 |
| 2005/0275626 | A1 | 12/2005 | Mueller | WO | WO96/41098 | 12/1996 |
| 2005/0276053 | A1 | 12/2005 | Nortrup | WO | WO99/30537 | 6/1999 |
| 2006/0002110 | A1 | 1/2006 | Dowling | WO | WO01/73818 | 10/2001 |
| 2006/0290624 | A1 | 12/2006 | Ashdown | | | |

FOREIGN PATENT DOCUMENTS

| | | |
|---|---|---|
| CA | 2178432 | 12/1996 |
| EP | 495305 A2 | 7/1992 |
| EP | 0534710 B1 | 1/1996 |
| EP | 0752632 A3 | 1/1997 |
| EP | 823813 A2 | 2/1998 |
| EP | 935234 A1 | 8/1999 |
| EP | 942631 A2 | 9/1999 |
| EP | 1020352 A2 | 7/2000 |
| EP | 1113215 A2 | 7/2001 |

OTHER PUBLICATIONS

DS96177 RS-485/RS-422 "Differential Bus Repeater," National Semiconductor Corporation, Oct. 1993, pp. 1-8.

DS2003/DS9667/DS2004 "High Current/Voltage Darlington Drivers," National Semiconductor Corporation, Dec. 1995, pp. 1-8.

LM140A/LM140/LM340A/LM7800C Series "3-Terminal Positive Regulators," National Semiconductor Corporation, Jan. 1995, pp. 1-14.

"http://www.luminus.cx/projects/chaser," (Nov. 13, 2000), pp. 1-16.

* cited by examiner

METHODS AND APPARATUS FOR CONTROLLED LIGHTING BASED ON A REFERENCE GAMUT

CROSS-REFERENCES TO RELATED APPLICATIONS

The present application claims the benefit, under 35 U.S.C. §119(e), of U.S. Provisional Application Ser. No. 60/637,554, filed Dec. 20, 2004, entitled "Systems and Methods for Emulating Illuminated Surfaces."

The present application also claims the benefit, under 35 U.S.C. §120, as a continuation-in-part of U.S. Nonprovisional application Ser. No. 11/081,020, filed Mar. 15, 2005, entitled "Methods and Systems for Providing Lighting Systems," which in turn claims priority to U.S. Provisional Application Ser. No. 60/553,111, filed Mar. 15, 2004, entitled "Lighting Methods and Systems."

Each of the foregoing applications is hereby incorporated herein by reference.

FIELD OF THE DISCLOSURE

The present disclosure relates to the generation of variable color light or variable color temperature white light using multiple different lighting units, wherein the lighting units are configured to generate the variable color or variable color temperature light based on a common reference color gamut.

BACKGROUND

To create multi-colored or white light based on additive color mixing principles, often multiple different sources of colored light are employed, for example red light, blue light and green light, to represent the "primary" colors. These three primary colors roughly represent the respective spectral sensitivities typical of the three different types of cone receptors in the human eye (having peak sensitivities at approximately 650 nanometers for red, 530 nanometers for green, and 425 nanometers for blue) under photopic (i.e., daytime, or relatively bright) viewing conditions. Much research has shown that additive mixtures of primary colors in different proportions can create a wide range of colors discernible to humans. This is the well-known principle on which many color displays are based, in which a red light emitter, a blue light emitter, and a green light emitter are energized in different proportions to create a wide variety of perceivably different colors, as well as white light, based on additive mixing of the primary colors.

A visual stimulus corresponding to a perceivable color can be described in terms of the energy emission of a light source that gives rise to the visual stimulus. A "spectral power distribution" (SPD) of the energy emission from a light source often is expressed as a function of wavelength λ, and provides an indication of an amount of radiant power per small constant-width wavelength interval that is present in the energy emission throughout the visible spectrum. The SPD of energy emission from a light source may be measured via spectroradiometer, spectrophotometer or other suitable instrument. A given visual stimulus may be thought of generally in terms of its overall perceived strength and color, both of which relate to its SPD.

One measure of describing the perceived strength of a visual stimulus, based on the energy emitted from a light source that gives rise to the visual stimulus, is referred to as "luminous intensity," for which the unit of "candela" is defined. Specifically, the unit of candela is defined such that a monochromatic light source having a wavelength of 555 nanometers (to which the human eye is most sensitive) radiating 1/683 Watts of power in one steradian has a luminous intensity of 1 candela (a steradian is the cone of light spreading out from the source that would illuminate one square meter of the inner surface of a sphere of 1 meter radius around the source). The luminous intensity of a light source in candelas therefore represents a particular direction of light emission (i.e., a light source can be emitting with a luminous intensity of one candela in each of multiple directions, or one candela in merely one relatively narrow beam in a given direction).

From the definition above, it may be appreciated that the luminous intensity of a light source is independent of the distance at which the light emission ultimately is observed and, hence, the apparent size of the source to an observer. Accordingly, luminous intensity in candelas itself is not necessarily representative of the perceived strength of the visual stimulus; rather, a measure of the perceived strength of a visual stimulus that takes into consideration the apparent area of a source from which light is emitted in a given direction is referred to as "luminance," having units of candelas per square meter ($cd/m^2$). The human eye can detect luminances from as little as one millionth of a $cd/m^2$ up to approximately one million $cd/m^2$ before damage to the eye may occur.

The luminance of a visual stimulus also takes into account the photopic (or scotopic) response of human vision. Recall from the definition of candela above that radiant power is given in terms of a reference wavelength of 555 nanometers. Accordingly, to account for the response of human vision to wavelengths other than 555 nanometers, the luminance of the stimulus (assuming photopic conditions) typically id determined by applying a photopic response function $V(\lambda)$ to the spectral power distribution (SPD) of the light source giving rise to the stimulus. For example, the luminance L of a given visual stimulus under photopic conditions may be given by:

$$L = K(P_1 V_1 + P_2 V_2 + P_3 V_3 + \ldots), \tag{1}$$

where $P_1$, $P_2$, $P_3$, etc., are points on the SPD indicating the amount of power per small constant-width wavelength interval throughout the visible spectrum, $V_1$, $V_2$, and $V_3$, etc., are the values of the $V(\lambda)$ function at the central wavelength of each interval, and K is a constant. If K is set to a value of 683 and P is the radiance in watts per steradian per square meter, then L represents luminance in units of candelas per square meter ($cd/m^2$).

The "chromaticity" of a given visual stimulus refers generally to the perceived color of the stimulus. A "spectral" color is often considered as a perceived color that can be correlated with a specific wavelength of light. The perception of a visual stimulus having multiple wavelengths, however, generally is more complicated; for example, in human vision it is found that many different combinations of light wavelengths can produce the same perception of color.

Chromaticity is sometimes described in terms of two properties, namely, "hue" and "saturation." Hue generally refers to the overall category of perceivable color of the stimulus (e.g., purple, blue, green, yellow, orange, red), whereas saturation generally refers to the degree of white which is mixed with a perceivable color. For example, pink may be thought of as having the same hue as red, but being less saturated. Stated differently, a fully saturated hue is one with no mixture of white. Accordingly, a "spectral hue"

(consisting of only one wavelength, e.g., spectral red or spectral blue) by definition is fully saturated. However, one can have a fully saturated hue without having a spectral hue (consider a fully saturated magenta, which is a combination of two spectral hues, i.e., red and blue).

A "color model" that describes a given visual stimulus may be defined in terms based on, or related to, luminance (perceived strength or brightness) and chromaticity (hue and saturation). Color models (sometimes referred to alternatively as color systems or color spaces) can be described in a variety of manners to provide a construct for categorizing visual stimuli as well as communicating information to and from color devices regarding different colors. Some examples of conventional color models employed in the relevant arts include the RGB (red, green, blue) model, the CMY (cyan, magenta, yellow) model, the HSI (hue, saturation, intensity) model, the YIQ (luminance, in-phase, quadrature) model, the Munsell system, the Natural Color System (NCS), the DIN system, the Coloroid System, the Optical Society of America (OSA) system, the Hunter Lab system, the Ostwald system, and various CIE coordinate systems in two and three dimensions (e.g., CIE x,y; CIE u',v'; CIELUV, CIELAB). For purposes of illustrating an exemplary color system, the CIE x,y coordinate system is discussed in detail below. It should be appreciated, however, that the concepts disclosed herein generally are applicable to any of a variety of constructs used to describe a color model, space, or system.

One example of a commonly used model for expressing color is illustrated by the CIE chromaticity diagram shown in FIG. 1, and is based on the CIE color system. In one implementation, the CIE system characterizes a given visual stimulus by a luminance parameter Y and two chromaticity coordinates x and y that specify a particular point on the chromaticity diagram shown in FIG. 1. The CIE system parameters Y, x and y are based on the SPD of the stimulus, and also take into consideration various color sensitivity functions which correlate generally with the response of the human eye.

More specifically, colors perceived during photopic response essentially are a function of three variables, corresponding generally to the three different types of cone receptors in the human eye. Hence, the evaluation of color from SPD may employ three different spectral weighting functions, each generally corresponding to one of the three different types of cone receptors. These three functions are referred to commonly as "color matching functions," and in the CIE systems these color matching functions typically are denoted as $\bar{x}(\lambda)$, $\bar{y}(\lambda)$, $\bar{z}(\lambda)$. Each of the color matching functions $\bar{x}(\lambda)$, $\bar{y}(\lambda)$, $\bar{z}(\lambda)$ may be applied individually to the SPD of a visual stimulus in question, in a manner similar to that discussed above in Eq. (1) above (in which the respective components $V_1$, $V_2$, $V_3$ . . . of $V(\lambda)$ are substituted by corresponding components of a given color matching function), to generate three corresponding CIE "primaries" or "tristimulus values," commonly denoted as X, Y, and Z.

As mentioned above, the tristimulus value Y is taken to represent luminance in the CIE system and hence is commonly referred to as the luminance parameter (the color matching function $\bar{y}(\lambda)$ is intentionally defined to match the photopic response function $V(\lambda)$, such that the CIE tristimulus value Y=L, pursuant to Eq. (1) above). Although the value Y correlates with luminance, the CIE tristimulus values X and Z do not substantially correlate with any perceivable attributes of the stimulus. However, in the CIE system, important color attributes are related to the relative magnitudes of the tristimulus values, which are transformed into "chromaticity coordinates" x, y, and z based on normalization of the tristimulus values as follows:

$$x=X/(X+Y+Z)$$

$$y=Y/(X+Y+Z)$$

$$z=Z/(X+Y+Z).$$

Based on the normalization above, clearly x+y+z=1, so that only two of the chromaticity coordinates are actually required to specify the results of mapping an SPD to the CIE system.

In the CIE chromaticity diagram shown in FIG. 1, the chromaticity coordinate x is plotted along the horizontal axis, while the chromaticity coordinate y is plotted along the vertical axis. The chromaticity coordinates x and y depend only on hue and saturation, and are independent of the amount of luminous energy in the stimulus; stated differently, perceived colors with the same chromaticity, but different luminance, all map to the same point x,y on the CIE chromaticity diagram. The curved line 50 in the diagram of FIG. 1 serving as the upper perimeter of the enclosed area indicates all of the spectral colors (pure wavelengths) and is often referred to as the "spectral locus" (the wavelengths along the curve are indicated in nanometers). Again, the colors falling on the line 50 are by definition fully saturated colors. The straight line 52 at the bottom of the enclosed area in the diagram, connecting the blue (approximately 420 nanometers) and red (approximately 700 nanometers) ends, is referred to as the "purple boundary" or the "line of purples." This line represents colors that cannot be produced by any single wavelength of light; however, a point along the purple boundary nonetheless may be considered to represent a fully saturated color. The area bounded by the spectral locus 50 and the purple boundary 52 represents the full "color gamut" of human vision.

In FIG. 1, an "achromatic point" E is indicated at the coordinates x=y=⅓, representing full spectrum white. Hence, colors generally are deemed to become less saturated as one moves from the boundaries of the enclosed area toward the point E. FIG. 2 provides another illustration of the chromaticity diagram shown in FIG. 1, in which approximate color regions are indicated for general reference, including a region around the achromatic point E corresponding to generally perceived white light.

White light often is discussed in terms of "color temperature" rather than "color;" the term "color temperature" essentially refers to a particular subtle color content or shade (e.g., reddish, bluish) of white light. The color temperature of a given white light visual stimulus conventionally is characterized according to the temperature in degrees Kelvin (K) of a black body radiator that radiates essentially the same spectrum as the white light visual stimulus in question. Black body radiator color temperatures fall within a range of from approximately 700 degrees K (generally considered the first visible to the human eye) to over 10,000 degrees K; white light typically is perceived at color temperatures above 1500-2000 degrees K. Lower color temperatures generally indicate white light having a more significant red component or a "warmer feel," while higher color temperatures generally indicate white light having a more significant blue component or a "cooler feel."

FIG. 3 shows a lower portion of the chromaticity diagram of FIG. 2, onto which is mapped a "white light/black body curve" 54, illustrating representative CIE coordinates of a black body radiator and the corresponding color temperatures. As can be seen in FIG. 3, a significant portion of the white light/black body curve 54 (from about 2800 degrees K to well above 10,000 degrees K) falls within the region of the CIE diagram generally identified as corresponding to white light (the achromatic point E corresponds approximately to a color temperature of 5500 degrees K). As discussed above, color temperatures below about 2800 degrees K fall into regions of the CIE diagram that typically are associated with "warmer" white light (i.e., moving from yellow to orange to red).

A lighting unit may be configured to generate variable color light or variable color temperature white light based on additive mixing of multiple sources having respective different spectrums. Such a lighting unit may be evaluated in terms of its color generation capability (i.e., an overall range of colors that may be generated) via any one of a variety of color models/spaces/systems. As discussed above in connection with FIG. 1, the CIE color system provides one conventional example of a useful construct for categorizing color, via the CIE chromaticity diagram for example. While the discussion below continues to rely on the CIE color system (and, in particular, the CIE chromaticity diagram) as a construct for evaluating color generation capability of a lighting unit, again it should be appreciated that the concepts disclosed herein generally are applicable to any of a variety of other color models, spaces, or systems that may be employed to evaluate the color generation capability of one or more lighting units.

To illustrate the concept of evaluating a lighting unit for color generation capability, consider a lighting unit that is configured to generate and mix red light, green light, and blue light in various combinations and proportions to create different colors or color temperatures of light (as discussed above, the colors red, green and blue are perhaps somewhat natural choices as they represent "primary" colors of human vision). In terms of the CIE color system, each different source spectrum of the lighting unit (i.e., each of the red light, the green light and the blue light) may be mapped to a corresponding point on the CIE chromaticity diagram, thereby determining a region of the diagram that specifies all of the possible colors (or color temperatures) that may be generated by the lighting unit via additive mixing.

To this end, first a spectral power distribution (SPD) may be measured or estimated (e.g., based on one or more of an expected/approximate dominant wavelength, bandwidth, and radiant power) for each of the different source spectrums of the lighting unit. Typically, the SPDs are measured (or estimated) at maximum available radiant powers for the respective source spectrums. Thus, a red SPD, a green SPD and a blue SPD are obtained, each at maximum available power. Subsequently, CIE chromaticity coordinates x,y are calculated for each SPD in the manner described above in connection with FIG. 1 (i.e., using the color matching functions to obtain tristimulus values X, Y, and Z, and then normalizing), and the calculated coordinates are plotted as points on the CIE chromaticity diagram.

FIG. 4 illustrates the CIE chromaticity diagram of FIG. 1, onto which are mapped exemplary x,y chromaticity coordinates generally indicative of red, green and blue sources that may be employed in one type of lighting unit. The resulting three points 60R, 60G and 60B form an enclosed area (i.e., triangle) referred to as a color gamut 60, representing the colors that may be generated by the lighting unit using the red, green and blue sources based on additive mixing. In FIG. 4, the white light/black body curve 54 and the achromatic point E also are illustrated; as can be seen, a significant portion of the curve 54 falls within the gamut 60, indicating that the lighting unit under evaluation is capable of generating a variety of color temperatures of white light in addition to a variety of more saturated colors within the gamut 60.

It should be appreciated that the gamut 60 shown in FIG. 4 is determined by the particular red, green and blue light sources employed in the specific lighting unit under evaluation. Stated differently, another lighting unit also employing red, green and blue light sources may not have exactly the same color gamut 60 shown in FIG. 4. One reason for this is that one or more of the red, green and blue light generated in one lighting unit may not have exactly or even substantially the same SPD as the corresponding red, green and blue light generated in another lighting unit.

The foregoing situation may arise because of salient spectral differences between any "same color" light sources in the two fixtures including, but not limited to, intentional spectrum specification differences based on the type of source (wideband vs. narrowband sources, slightly different dominant wavelengths), unintentional manufacturing differences that affect spectrum, different aging and/or thermal properties that affect spectrum, etc. Thus, for example, if the red light from one lighting unit has a first red SPD, and the red light from another lighting unit has a second red SPD different from the first red SPD, the respective red x,y chromaticity coordinates for the two lighting units will be different, resulting in different color gamuts for the two lighting units (the same could be said for different green SPDs and/or different blue SPDs for the two lighting units).

FIG. 5 illustrates this situation, showing a second color gamut 60-1 corresponding to a second lighting unit having red, green and blue sources, plotted together with the color gamut 60 from FIG. 4. From FIG. 5, it can be readily observed that each of the red, green and blue chromaticity coordinates for the gamut 60-1 is notably different than those defining the gamut 60, thereby indicating the slightly different spectrums of the "same color" sources in the two lighting units.

SUMMARY

In view of the foregoing, Applicants have recognized and appreciated that multiple lighting units, each configured to generate variable color light or variable color temperature white light based on additive mixing of multiple light sources, may not be capable of generating substantially the same range of colors or color temperatures of light even though the lighting units employ generally similar light sources.

Moreover, if two or more such lighting units receive instructions (e.g. lighting commands) intended to cause the generation of the same color (or color temperature) of light from multiple units, each lighting unit may in fact generate a perceivably different color (or color temperature) of light, based at least in part on their respective different gamuts (e.g., as determined by the different chromaticity coordinates of their respective "same color" sources). If two or more such lighting units are deployed together, for example, as components of a lighting system (e.g., to provide general purpose illumination or other types of lighting in tandem in a given environment), inconsistent, unpredictable, and generally undesirable artifacts may result in the generation of variable color light or variable color temperature white light.

Accordingly, various embodiments of the present disclosure are directed to methods and apparatus for controlled lighting based on a reference color gamut that is shared amongst multiple lighting units. Pursuant to the methods and apparatus disclosed herein, in one embodiment a reference color gamut may be determined for multiple lighting units based on spectral power distributions (SPDs) associated with a group of lighting units forming a "sample space." Variable color light or variable color temperature white light subsequently may be generated consistently and predictably amongst multiple lighting units that are each controlled based on the reference color gamut. In one aspect, lighting commands received by multiple lighting units may be appropriately processed in each lighting unit, based on a predetermined relationship between the lighting commands and the reference color gamut, to ensure consistent and predictable color or color temperature reproduction amongst the multiple units. In one exemplary implementation, the multiple lighting units include LED light sources to facilitate energy efficient generation and versatile control of variable color light or variable color temperature white light, for general purpose illumination or other lighting applications.

For example, one embodiment is directed to a method for specifying a reference color gamut for a plurality of lighting units, wherein the reference color gamut defines an essentially identical range of colors or color temperatures that may be generated by each of the plurality of lighting units. Each lighting unit is configured to generate multiple colors or color temperatures of light based on an additive mixing of at least first light having a first spectrum and second light having a second spectrum, wherein the first and second spectrums are different. The method comprises acts of: representing a plurality of spectral power distributions (SPDs) on a color space, the plurality of SPDs including at least one spectral power distribution (SPD) for each of at least the first light and the second light generated by each of the plurality of lighting units; and specifying the reference color gamut in the color space, based on the act A), such that any color that is included in the reference color gamut can be generated by any lighting unit of the plurality of lighting units.

Another embodiment is directed to an apparatus, comprising at least one first LED configured to generate first light having a first spectrum, at least one second LED configured to generate second light having a second spectrum different from the first spectrum, and at least one controller configured to control the first and second light based at least in part on a reference color gamut that establishes a range of colors or color temperatures of perceived light than can be generated by the apparatus.

As used herein for purposes of the present disclosure, the term "LED" should be understood to include any electroluminescent diode or other type of carrier injection/junction-based system that is capable of generating radiation in response to an electric signal. Thus, the term LED includes, but is not limited to, various semiconductor-based structures that emit light in response to current, light emitting polymers, electroluminescent strips, and the like.

In particular, the term LED refers to light emitting diodes of all types (including semi-conductor and organic light emitting diodes) that may be configured to generate radiation in one or more of the infrared spectrum, ultraviolet spectrum, and various portions of the visible spectrum (generally including radiation wavelengths from approximately 400 nanometers to approximately 700 nanometers). Some examples of LEDs include, but are not limited to, various types of infrared LEDs, ultraviolet LEDs, red LEDs, blue LEDs, green LEDs, cyan LEDs, yellow LEDs, amber LEDs, orange LEDs, and white LEDs (discussed further below). It also should be appreciated that LEDs may be configured and/or controlled to generate radiation having various bandwidths (e.g., various full widths at half maximum, or FWHM) for a given spectrum (e.g., narrow bandwidth, broad bandwidth), and a variety of dominant wavelengths within a given general color categorization.

For example, one implementation of an LED configured to generate essentially white light (e.g., a white LED) may include a number of dies which respectively emit different spectra of electroluminescence that, in combination, mix to form essentially white light. In another implementation, a white light LED may be associated with a phosphor material that converts electroluminescence having a first spectrum to a different second spectrum. In one example of this implementation, electroluminescence having a relatively short wavelength and narrow bandwidth spectrum "pumps" the phosphor material, which in turn radiates longer wavelength radiation having a somewhat broader spectrum.

It should also be understood that the term LED does not limit the physical and/or electrical package type of an LED. For example, as discussed above, an LED may refer to a single light emitting device having multiple dies that are configured to respectively emit different spectra of radiation (e.g., that may or may not be individually controllable). Also, an LED may be associated with a phosphor that is considered as an integral part of the LED (e.g., some types of white LEDs). In general, the term LED may refer to packaged LEDs, non-packaged LEDs, surface mount LEDs, chip-on-board LEDs, T-package mount LEDs, radial package LEDs, power package LEDs, LEDs including some type of encasement and/or optical element (e.g., a diffusing lens), etc.

The term "light source" should be understood to refer to any one or more of a variety of radiation sources, including, but not limited to, LED-based sources (including one or more LEDs as defined above), incandescent sources (e.g., filament lamps, halogen lamps), fluorescent sources, phosphorescent sources, high-intensity discharge sources (e.g., sodium vapor, mercury vapor, and metal halide lamps), lasers, other types of electroluminescent sources, pyro-luminescent sources (e.g., flames), candle-luminescent sources (e.g., gas mantles, carbon arc radiation sources), photo-luminescent sources (e.g., gaseous discharge sources), cathode luminescent sources using electronic satiation, galvano-luminescent sources, crystallo-luminescent sources, kine-luminescent sources, thermo-luminescent sources, triboluminescent sources, sonoluminescent sources, radioluminescent sources, and luminescent polymers.

A given light source may be configured to generate electromagnetic radiation within the visible spectrum, outside the visible spectrum, or a combination of both. Hence, the terms "light" and "radiation" are used interchangeably herein. Additionally, a light source may include as an integral component one or more filters (e.g., color filters), lenses, or other optical components. Also, it should be understood that light sources may be configured for a variety of applications, including, but not limited to, indication, display, and/or illumination. An "illumination source" is a light source that is particularly configured to generate radiation having a sufficient intensity to effectively illuminate an interior or exterior space. In this context, "sufficient intensity" refers to sufficient radiant power in the visible spectrum generated in the space or environment (the unit "lumens" often is employed to represent the total light output from a light source in all directions, in terms of radiant power or "luminous flux") to provide ambient illumination (i.e., light that may be perceived indirectly and that may be, for example, reflected off of one or more of a variety of intervening surfaces before being perceived in whole or part).

The term "spectrum" should be understood to refer to any one or more frequencies (or wavelengths) of radiation produced by one or more light sources. Accordingly, the term "spectrum" refers to frequencies (or wavelengths) not only in the visible range, but also frequencies (or wavelengths) in the infrared, ultraviolet, and other areas of the overall electromagnetic spectrum. Also, a given spectrum may have a relatively narrow bandwidth (e.g., a full-width at half maximum, or FWHM, spanning essentially few frequency or wavelength components) or a relatively wide bandwidth (several frequency or wavelength components having various relative strengths). It should also be appreciated that a given spectrum may be the result of a mixing of two or more other spectra (e.g., mixing radiation respectively emitted from multiple light sources).

For purposes of this disclosure, the term "color" is used interchangeably with the term "spectrum." However, the term "color" generally is used to refer primarily to a property of radiation that is perceivable by an observer (although this usage is not intended to limit the scope of this term). Accordingly, the terms "different colors" implicitly refer to multiple spectra having different wavelength components and/or bandwidths. It also should be appreciated that the term "color" may be used in connection with both white and non-white light.

The term "color temperature" generally is used herein in connection with white light, although this usage is not intended to limit the scope of this term. Color temperature essentially refers to a particular color content or shade (e.g., reddish, bluish) of white light. The color temperature of a given radiation sample conventionally is characterized according to the temperature in degrees Kelvin (K) of a black body radiator that radiates essentially the same spectrum as the radiation sample in question. Black body radiator color temperatures generally fall within a range of from approximately 700 degrees K (typically considered the first visible to the human eye) to over 10,000 degrees K; white light generally is perceived at color temperatures above 1500-2000 degrees K.

Lower color temperatures generally indicate white light having a more significant red component or a "warmer feel," while higher color temperatures generally indicate white light having a more significant blue component or a "cooler feel." By way of example, fire has a color temperature of approximately 1,800 degrees K, a conventional incandescent bulb has a color temperature of approximately 2848 degrees K, early morning daylight has a color temperature of approximately 3,000 degrees K, and overcast midday skies have a color temperature of approximately 10,000 degrees K. A color image viewed under white light having a color temperature of approximately 3,000 degree K has a relatively reddish tone, whereas the same color image viewed under white light having a color temperature of approximately 10,000 degrees K has a relatively bluish tone.

The terms "lighting unit" and "lighting fixture" are used interchangeably herein to refer to an apparatus including one or more light sources of same or different types. A given lighting unit may have any one of a variety of mounting arrangements for the light source(s), enclosure/housing arrangements and shapes, and/or electrical and mechanical connection configurations. Additionally, a given lighting unit optionally may be associated with (e.g., include, be coupled to and/or packaged together with) various other components (e.g., control circuitry) relating to the operation of the light source(s). An "LED-based lighting unit" refers to a lighting unit that includes one or more LED-based light sources as discussed above, alone or in combination with other non LED-based light sources.

The terms "processor" or "controller" are used herein interchangeably to describe various apparatus relating to the operation of one or more light sources. A processor or controller can be implemented in numerous ways, such as with dedicated hardware, using one or more microprocessors that are programmed using software (e.g., microcode) to perform the various functions discussed herein, or as a combination of dedicated hardware to perform some functions and programmed microprocessors and associated circuitry to perform other functions. Examples of processor or controller components that may be employed in various embodiments of the present invention include, but are not limited to, conventional microprocessors, application specific integrated circuits (ASICs), and field-programmable gate arrays (FPGAs).

In various implementations, a processor or controller may be associated with one or more storage media (generically referred to herein as "memory," e.g., volatile and non-volatile computer memory such as RAM, PROM, EPROM, and EEPROM, floppy disks, compact disks, optical disks, magnetic tape, etc.). In some implementations, the storage media may be encoded with one or more programs that, when executed on one or more processors and/or controllers, perform at least some of the functions discussed herein. Various storage media may be fixed within a processor or controller or may be transportable, such that the one or more programs stored thereon can be loaded into a processor or controller so as to implement various aspects of the present invention discussed herein. The terms "program" or "computer program" are used herein in a generic sense to refer to any type of computer code (e.g., software or microcode) that can be employed to program one or more processors or controllers.

The term "addressable" is used herein to refer to a device (e.g., a light source in general, a lighting unit or fixture, a controller or processor associated with one or more light sources or lighting units, other non-lighting related devices, etc.) that is configured to receive information (e.g., data) intended for multiple devices, including itself, and to selectively respond to particular information intended for it. The term "addressable" often is used in connection with a networked environment (or a "network," discussed further below), in which multiple devices are coupled together via some communications medium or media.

In one network implementation, one or more devices coupled to a network may serve as a controller for one or more other devices coupled to the network (e.g., in a master/slave relationship). In another implementation, a networked environment may include one or more dedicated controllers that are configured to control one or more of the devices coupled to the network. Generally, multiple devices coupled to the network each may have access to data that is present on the communications medium or media; however, a given device may be "addressable" in that it is configured to selectively exchange data with (i.e., receive data from and/or transmit data to) the network, based, for example, on one or more particular identifiers (e.g., "addresses") assigned to it.

The term "network" as used herein refers to any interconnection of two or more devices (including controllers or processors) that facilitates the transport of information (e.g. for device control, data storage, data exchange, etc.) between any two or more devices and/or among multiple devices coupled to the network. As should be readily appreciated, various implementations of networks suitable for interconnecting multiple devices may include any of a variety of network topologies and employ any of a variety of communication protocols. Additionally, in various networks according to the present invention, any one connection between two devices may represent a dedicated connection between the two systems, or alternatively a non-dedicated connection. In addition to carrying information intended for the two devices, such a non-dedicated connection may carry information not necessarily intended for either of the two devices (e.g., an open network connection). Furthermore, it should be readily appreciated that various networks of devices as discussed herein may employ one or more wireless, wire/cable, and/or fiber optic links to facilitate information transport throughout the network.

The term "user interface" as used herein refers to an interface between a human user or operator and one or more devices that enable communication between the user and the device(s). Examples of user interfaces that may be employed in various implementations of the present invention include, but are not limited to, switches, potentiometers, buttons, dials, sliders, a mouse, keyboard, keypad, various types of game controllers (e.g., joysticks), track balls, display screens, various types of graphical user interfaces (GUIs), touch screens, microphones and other types of sensors that may receive some form of human-generated stimulus and generate a signal in response thereto.

The following patents and patent applications are hereby incorporated herein by reference:

U.S. Pat. No. 6,016,038, issued Jan. 18, 2000, entitled "Multicolored LED Lighting Method and Apparatus;"

U.S. Pat. No. 6,211,626, issued Apr. 3, 2001, entitled "Illumination Components,"

U.S. Pat. No. 6,608,453, issued Aug. 19, 2003, entitled "Methods and Apparatus for Controlling Devices in a Networked Lighting System;"

U.S. Pat. No. 6,548,967, issued Apr. 15, 2003, entitled "Universal Lighting Network Methods and Systems;"

U.S. patent application Ser. No. 09/886,958, filed Jun. 21, 2001, entitled Method and Apparatus for Controlling a Lighting System in Response to an Audio Input;"

U.S. patent application Ser. No. 10/078,221, filed Feb. 19, 2002, entitled "Systems and Methods for Programming Illumination Devices;"

U.S. patent application Ser. No. 09/344,699, filed Jun. 25, 1999, entitled "Method for Software Driven Generation of Multiple Simultaneous High Speed Pulse Width Modulated Signals;"

U.S. patent application Ser. No. 09/805,368, filed Mar. 13, 2001, entitled "Light-Emitting Diode Based Products;"

U.S. patent application Ser. No. 09/716,819, filed Nov. 20, 2000, entitled "Systems and Methods for Generating and Modulating Illumination Conditions;"

U.S. patent application Ser. No. 09/675,419, filed Sep. 29, 2000, entitled "Systems and Methods for Calibrating Light Output by Light-Emitting Diodes;"

U.S. patent application Ser. No. 09/870,418, filed May 30, 2001, entitled "A Method and Apparatus for Authoring and Playing Back Lighting Sequences;"

U.S. patent application Ser. No. 10/045,604, filed Mar. 27, 2003, entitled "Systems and Methods for Digital Entertainment;"

U.S. patent application Ser. No. 10/045,629, filed Oct. 25, 2001, entitled "Methods and Apparatus for Controlling Illumination;"

U.S. patent application Ser. No. 09/989,677, filed Nov. 20, 2001, entitled "Information Systems;"

U.S. patent application Ser. No. 10/158,579, filed May 30, 2002, entitled "Methods and Apparatus for Controlling Devices in a Networked Lighting System;"

U.S. patent application Ser. No. 10/163,085, filed Jun. 5, 2002, entitled "Systems and Methods for Controlling Programmable Lighting Systems;"

U.S. patent application Ser. No. 10/174,499, filed Jun. 17, 2002, entitled "Systems and Methods for Controlling Illumination Sources;"

U.S. patent application Ser. No. 10/245,788, filed Sep. 17, 2002, entitled "Methods and Apparatus for Generating and Modulating White Light Illumination Conditions;"

U.S. patent application Ser. No. 10/245,786, filed Sep. 17, 2002, entitled "Light Emitting Diode Based Products;"

U.S. patent application Ser. No. 10/325,635, filed Dec. 19, 2002, entitled "Controlled Lighting Methods and Apparatus;"

U.S. patent application Ser. No. 10/360,594, filed Feb. 6, 2003, entitled "Controlled Lighting Methods and Apparatus;"

U.S. patent application Ser. No. 10/435,687, filed May 9, 2003, entitled "Methods and Apparatus for Providing Power to Lighting Devices;"

U.S. patent application Ser. No. 10/828,933, filed Apr. 21, 2004, entitled "Tile Lighting Methods and Systems;"

U.S. patent application Ser. No. 10/839,765, filed May 5, 2004, entitled "Lighting Methods and Systems;"

U.S. patent application Ser. No. 11/010,840, filed Dec. 13, 2004, entitled "Thermal Management Methods and Apparatus for Lighting Devices;"

U.S. patent application Ser. No. 11/079,904, filed Mar. 14, 2005, entitled "LED Power Control Methods and Apparatus;"

U.S. patent application Ser. No. 11/081,020, filed on Mar. 15, 2005, entitled "Methods and Systems for Providing Lighting Systems;"

U.S. patent application Ser. No. 11/178,214, filed Jul. 8, 2005, entitled "LED Package Methods and Systems;"

U.S. patent application Ser. No. 11/225,377, filed Sep. 12, 2005, entitled "Power Control Methods and Apparatus for Variable Loads;" and U.S. patent application Ser. No. 11/224,683, filed Sep. 12, 2005, entitled "Lighting Zone Control Methods and Systems."

It should be appreciated that all combinations of the foregoing concepts and additional concepts discussed in greater detail below are contemplated as being part of the inventive subject matter disclosed herein. In particular, all combinations of claimed subject matter appearing at the end of this disclosure are contemplated as being part of the inventive subject matter disclosed herein.

DETAILED DESCRIPTION

Various embodiments of the present disclosure are described below, including certain embodiments relating particularly to LED-based light sources. It should be appreciated, however, that the present disclosure is not limited to any particular manner of implementation, and that the various embodiments discussed explicitly herein are primarily for purposes of illustration. For example, the various concepts discussed herein may be suitably implemented in a variety of environments involving LED-based light sources, other types of light sources not including LEDs, environments that involve both LEDs and other types of light sources in combination, and environments that involve non-lighting-related devices alone or in combination with various types of light sources.

The present disclosure is directed to methods and apparatus for controlled lighting based on a reference color gamut that is shared amongst multiple lighting units. In particular, pursuant to the methods and apparatus disclosed herein, a reference color gamut may be determined for multiple lighting units based on spectral power distributions (SPDs) associated with a group of lighting units serving as a "sample space." Variable color light or variable color temperature white light subsequently may be generated consistently and predictably amongst multiple lighting units that are each controlled based on the reference color gamut. In various embodiments, lighting commands received by multiple lighting units may be appropriately processed in each lighting unit, based on a predetermined relationship between the lighting command and the reference color gamut, to ensure consistent and predictable color or color temperature reproduction amongst the multiple units.

Figure 6:
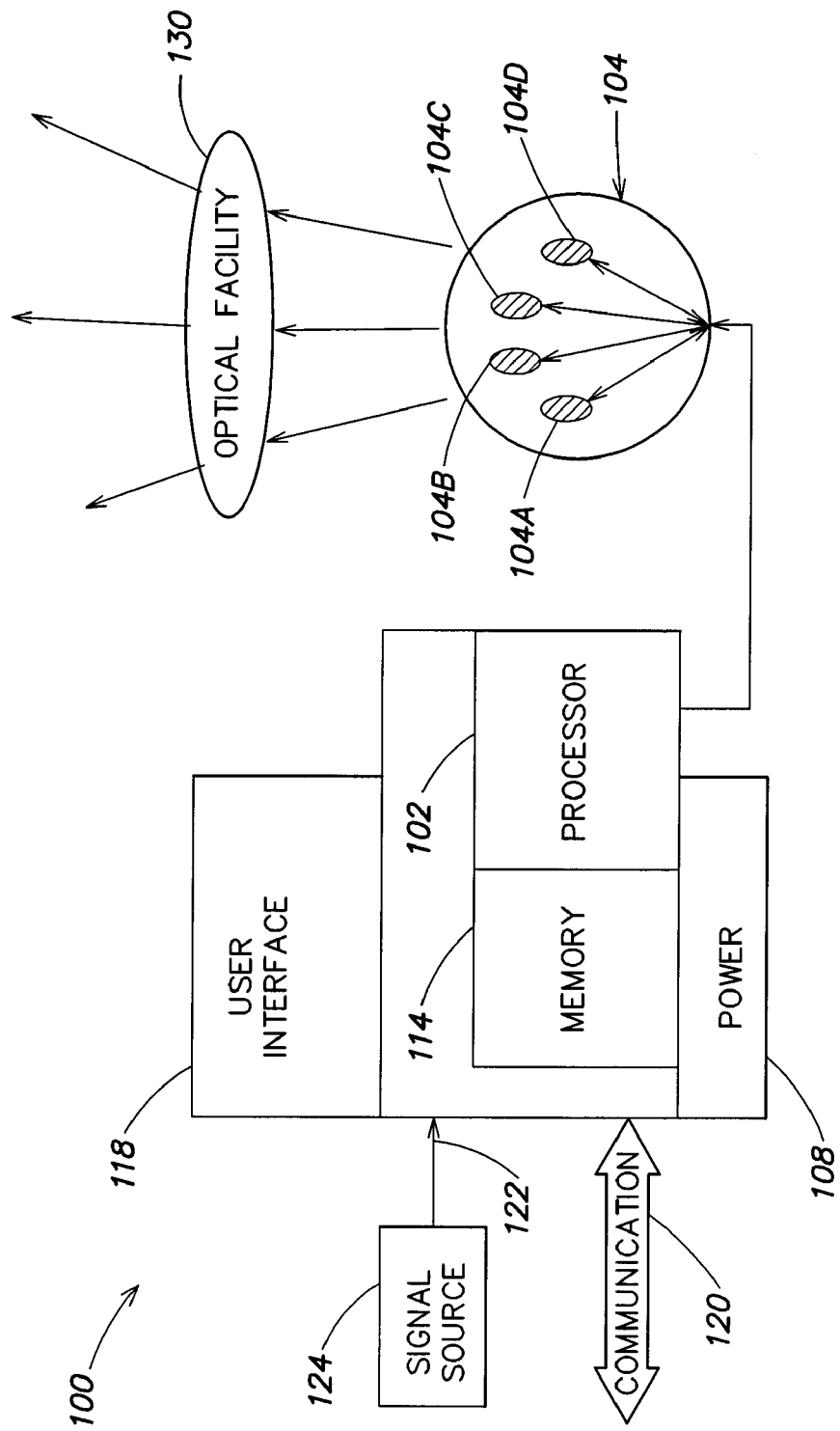
FIG. 6 is a diagram illustrating a lighting unit according to one embodiment of the disclosure.

In some exemplary implementations, the multiple lighting units may include LED light sources to facilitate energy efficient generation and versatile control of variable color light or variable color temperature white light, for general purpose illumination or any of a variety of other lighting applications. FIG. 6 illustrates one example of an LED-based lighting unit 100 that may be configured according to various embodiments of the present disclosure to provide variable color light or variable color-temperature white light based on a reference color gamut. Some examples of LED-based lighting units similar to those that are described below in connection with FIG. 6 may be found, for example, in U.S. Pat. No. 6,016,038, issued Jan. 18, 2000 to Mueller et al., entitled "Multicolored LED Lighting Method and Apparatus," and U.S. Pat. No. 6,211,626, issued Apr. 3, 2001 to Lys et al, entitled "Illumination Components," which patents are both hereby incorporated herein by reference.

In various embodiments of the present disclosure, the lighting unit 100 shown in FIG. 6 may be used alone or together with other similar lighting units in a system of lighting units (e.g., as discussed further below in connection with FIG. 7). Used alone or in combination with other lighting units, the lighting unit 100 may be employed in a variety of applications including, but not limited to, interior or exterior space (e.g., architectural) illumination in general, direct or indirect illumination of objects or spaces, theatrical or other entertainment-based/special effects lighting, decorative lighting, safety-oriented lighting, vehicular lighting, illumination of displays and/or merchandise (e.g. for advertising and/or in retail/consumer environments), combined illumination and communication systems, etc., as well as for various indication, display and informational purposes.

Additionally, one or more lighting units similar to that described in connection with FIG. 6 may be implemented in a variety of products including, but not limited to, various forms of light modules or bulbs having various shapes and electrical/mechanical coupling arrangements (including replacement or "retrofit" modules or bulbs adapted for use in conventional sockets or fixtures), as well as a variety of consumer and/or household products (e.g., night lights, toys, games or game components, entertainment components or systems, utensils, appliances, kitchen aids, cleaning products, etc.) and architectural components (e.g., lighted panels for walls, floors and ceilings, lighted trim or other ornamental pieces, etc.).

In one embodiment, the lighting unit 100 shown in FIG. 6 may include one or more light sources 104A, 104B, and 104C (shown collectively as 104), wherein one or more of the light sources may be an LED-based light source that includes one or more light emitting diodes (LEDs). In one aspect of this embodiment, any two or more of the light sources 104A, 104B, and 104C may be adapted to generate radiation of different colors (e.g. red, green, and blue, respectively). Although FIG. 6 shows three light sources 104A, 104B, and 104C, it should be appreciated that the lighting unit is not limited in this respect, as different numbers and various types of light sources (all LED-based light sources, LED-based and non-LED-based light sources in combination, etc.) adapted to generate radiation of a variety of different colors, including essentially white light, may be employed in the lighting unit 100, as discussed further below.

As shown in FIG. 6, the lighting unit 100 also may include a processor 102 that is configured to output one or more control signals to drive the light sources 104A, 104B, and 104C so as to generate various intensities of light from the light sources. For example, in one implementation, the processor 102 may be configured to output at least one control signal for each light source so as to independently control the intensity of light (e.g., radiant power in lumens) generated by each light source. Some examples of control signals that may be generated by the processor to control the light sources include, but are not limited to, pulse modulated signals, pulse width modulated signals (PWM), pulse amplitude modulated signals (PAM), pulse code modulated signals (PCM) analog control signals (e.g., current control signals, voltage control signals), combinations and/or modulations of the foregoing signals, or other control signals. In one aspect, one or more modulation techniques provide for variable control using a fixed current level applied to one or more LEDs, so as to mitigate potential undesirable or unpredictable variations in LED output that may arise if a variable LED drive current were employed. In another aspect, the processor 102 may control other dedicated circuitry (not shown in FIG. 6) which in turn controls the light sources so as to vary their respective intensities.

In one embodiment of the lighting unit 100, one or more of the light sources 104A, 104B, and 104C shown in FIG. 6 may include a group of multiple LEDs or other types of light sources (e.g., various parallel and/or serial connections of LEDs or other types of light sources) that are controlled together by the processor 102. Additionally, it should be appreciated that one or more of the light sources 104A, 104B, and 104C may include one or more LEDs that are adapted to generate radiation having any of a variety of spectra (i.e., wavelengths or wavelength bands), including, but not limited to, various visible colors (including essentially white light), various color temperatures of white light, ultraviolet, or infrared. LEDs having a variety of spectral bandwidths (e.g., narrow band, broader band) may be employed in various implementations of the lighting unit 100.

In another aspect of the lighting unit 100 shown in FIG. 6, the lighting unit 100 may be constructed and arranged to produce a wide range of variable color radiation. For example, the lighting unit 100 may be particularly arranged such that the processor-controlled variable intensity (i.e., variable radiant power) light generated by two or more of the light sources combines to produce a mixed colored light (including essentially white light having a variety of color temperatures). In particular, the color (or color temperature) of the mixed colored light may be varied by varying one or more of the respective intensities (output radiant power) of the light sources (e.g., in response to one or more control signals output by the processor 102). Furthermore, the processor 102 may be particularly configured (e.g., programmed) to provide control signals to one or more of the light sources so as to generate a variety of static or time-varying (dynamic) multi-color (or multi-color temperature) lighting effects.

Thus, the lighting unit 100 may include a wide variety of colors of LEDs in various combinations, including two or more of red, green, and blue LEDs to produce a color mix, as well as one or more other LEDs to create varying colors and color temperatures of white light. For example, red, green and blue can be mixed with amber, white, UV, orange, IR or other colors of LEDs. As discussed above in connection with FIGS. 1-4, such combinations of differently colored LEDs in the lighting unit 100 can facilitate accurate reproduction of a host of desirable spectrums of lighting conditions, examples of which include, but are not limited to, a variety of outside daylight equivalents at different times of the day, various interior lighting conditions, lighting conditions to simulate a complex multicolored background, and the like. Other desirable lighting conditions can be created by removing particular pieces of spectrum that may be specifically absorbed, attenuated or reflected in certain environments. Water, for example tends to absorb and attenuate most non-blue and non-green colors of light, so underwater applications may benefit from lighting conditions that are tailored to emphasize or attenuate some spectral elements relative to others.

As shown in FIG. 6, the lighting unit 100 also may include a memory 114 to store various information. For example, the memory 114 may be employed to store one or more lighting programs for execution by the processor 102 (e.g., to generate one or more control signals for the light sources), as well as various types of data useful for generating variable color radiation (e.g., calibration information, discussed further below). The memory 114 also may store one or more particular identifiers (e.g., a serial number, an address, etc.) that may be used either locally or on a system level to identify the lighting unit 100. In various embodiments, such identifiers may be pre-programmed by a manufacturer, for example, and may be either alterable or non-alterable thereafter (e.g., via some type of user interface located on the lighting unit, via one or more data or control signals received by the lighting unit, etc.). Alternatively, such identifiers may be determined at the time of initial use of the lighting unit in the field, and again may be alterable or non-alterable thereafter.

One issue that may arise in connection with controlling multiple light sources in the lighting unit 100 of FIG. 6, and controlling multiple lighting units 100 in a lighting system (e.g., as discussed below in connection with FIG. 7), relates to potentially perceptible differences in light output between substantially similar light sources. For example, given two virtually identical light sources being driven by respective identical control signals, the actual intensity of light (e.g., radiant power in lumens) output by each light source may be measurably different. Such a difference in light output may be attributed to various factors including, for example, slight manufacturing differences between the light sources, normal wear and tear over time of the light sources that may differently alter the respective spectrums of the generated radiation, etc. For purposes of the present discussion, light sources for which a particular relationship between a control signal and resulting output radiant power are not known are referred to as "uncalibrated" light sources.

The use of one or more uncalibrated light sources in the lighting unit 100 shown in FIG. 6 may result in generation of light having an unpredictable, or "uncalibrated," color or color temperature. For example, consider a first lighting unit including a first uncalibrated red light source and a first uncalibrated blue light source, each controlled by a corresponding control signal having an adjustable parameter in a range of from zero to 255 (0-255), wherein the maximum value of 255 represents the maximum radiant power available from the light source. For purposes of this example, if the red control signal is set to zero and the blue control signal is non-zero, blue light is generated, whereas if the blue control signal is set to zero and the red control signal is non-zero, red light is generated. However, if both control signals are varied from non-zero values, a variety of perceptibly different colors may be produced (e.g., in this example, at very least, many different shades of purple are possible). In particular, perhaps a particular desired color (e.g., lavender) is given by a red control signal having a value of 125 and a blue control signal having a value of 200.

Now consider a second lighting unit including a second uncalibrated red light source substantially similar to the first uncalibrated red light source of the first lighting unit, and a second uncalibrated blue light source substantially similar to the first uncalibrated blue light source of the first lighting unit. As discussed above, even if both of the uncalibrated red light sources are driven by respective identical control signals, the actual intensity of light (e.g., radiant power in lumens) output by each red light source may be measurably different. Similarly, even if both of the uncalibrated blue light sources are driven by respective identical control signals, the actual light output by each blue light source may be measurably different.

With the foregoing in mind, it should be appreciated that if multiple uncalibrated light sources are used in combination in lighting units to produce a mixed colored light as discussed above, the observed color (or color temperature) of light produced by different lighting units under identical control conditions may be perceivably different. Specifically, consider again the "lavender" example above; the "first lavender" produced by the first lighting unit with a red control signal having a value of 125 and a blue control signal having a value of 200 indeed may be perceivably different than a "second lavender" produced by the second lighting unit with a red control signal having a value of 125 and a blue control signal having a value of 200. More generally, the first and second lighting units generate uncalibrated colors by virtue of their uncalibrated light sources.

In view of the foregoing, in one embodiment of the present disclosure, the lighting unit 100 includes calibration means to facilitate the generation of light having a calibrated (e.g., predictable, reproducible) color at any given time. In one aspect, the calibration means is configured to adjust (e.g., scale) the light output of at least some light sources of the lighting unit so as to compensate for perceptible differences between similar light sources used in different lighting units.

For example, in one embodiment, the processor 102 of the lighting unit 100 is configured to control one or more of the light sources 104A, 104B, and 104C so as to output radiation at a calibrated intensity that substantially corresponds in a predetermined manner to a control signal for the light source(s). As a result of mixing radiation having different spectra and respective calibrated intensities, a calibrated color is produced. In one aspect of this embodiment, at least one calibration value for each light source is stored in the memory 114, and the processor is programmed to apply the respective calibration values to the control signals for the corresponding light sources so as to generate the calibrated intensities.

In one aspect of this embodiment, one or more calibration values may be determined once (e.g., during a lighting unit manufacturing/testing phase) and stored in the memory 114 for use by the processor 102. In another aspect, the processor 102 may be configured to derive one or more calibration values dynamically (e.g. from time to time) with the aid of one or more photosensors, for example. In various embodiments, the photosensor(s) may be one or more external components coupled to the lighting unit, or alternatively may be integrated as part of the lighting unit itself. A photosensor is one example of a signal source that may be integrated or otherwise associated with the lighting unit 100, and monitored by the processor 102 in connection with the operation of the lighting unit. Other examples of such signal sources are discussed further below, in connection with the signal source 124 shown in FIG. 6.

One exemplary method that may be implemented by the processor 102 to derive one or more calibration values includes applying a reference control signal to a light source (e.g., corresponding to maximum output radiant power), and measuring (e.g., via one or more photosensors) an intensity of radiation (e.g., radiant power falling on the photosensor) thus generated by the light source. The processor may be programmed to then make a comparison of the measured intensity and at least one reference value (e.g., representing an intensity that nominally would be expected in response to the reference control signal). Based on such a comparison, the processor may determine one or more calibration values (e.g., essentially scaling factors) for the light source. In particular, the processor may derive a calibration value such that, when applied to the reference control signal, the light source outputs radiation having an intensity that corresponds to the reference value (i.e., an "expected" intensity, e.g., expected radiant power in lumens).

In various aspects, one calibration value may be derived for an entire range of control signal/output intensities for a given light source. Alternatively, multiple calibration values may be derived for a given light source (i.e., a number of calibration value "samples" may be obtained) that are respectively applied over different control signal/output intensity ranges, to approximate a nonlinear calibration function in a piecewise linear manner.

It should be appreciated that the foregoing discussion regarding calibration values addresses the issue of generating a calibrated "intensity" or output radiant power for a particular given source spectrum of a lighting unit. Such a procedure makes it possible to ensure that a maximum output radiant power for a given source spectrum is essentially equivalent across multiple lighting units. However, the calibration procedure discussed above does not necessarily guarantee that the respective colors of light generated by a same combination of source spectrums in different lighting units will be perceivably the same. A more detailed discussion of generating light having a predictable output color (or color temperature) from multiple lighting units, based on the possibly different respective spectrums of "same colored sources" used in different lighting units (as opposed to merely possible different output powers associated with the source spectrums) is discussed below in connection with FIGS. 8-12.

In another aspect, as also shown in FIG. 6, the lighting unit 100 optionally may include one or more user interfaces 118 that are provided to facilitate any of a number of user-selectable settings or functions (e.g., generally controlling the light output of the lighting unit 100, changing and/or selecting various pre-programmed lighting effects to be generated by the lighting unit, changing and/or selecting various parameters of selected lighting effects, setting particular identifiers such as addresses or serial numbers for the lighting unit, etc.). In various embodiments, the communication between the user interface 118 and the lighting unit may be accomplished through wire or cable, or wireless transmission.

In one implementation, the processor 102 of the lighting unit monitors the user interface 118 and controls one or more of the light sources 104A, 104B, and 104C based at least in part on a user's operation of the interface. For example, the processor 102 may be configured to respond to operation of the user interface by originating one or more control signals for controlling one or more of the light sources. Alternatively, the processor 102 may be configured to respond by selecting one or more pre-programmed control signals stored in memory, modifying control signals generated by executing a lighting program, selecting and executing a new lighting program from memory, or otherwise affecting the radiation generated by one or more of the light sources.

In particular, in one implementation, the user interface 118 may constitute one or more switches (e.g., a standard wall switch) that interrupt power to the processor 102. In one aspect of this implementation, the processor 102 is configured to monitor the power as controlled by the user interface, and in turn control one or more of the light sources 104A, 104B, and 104C based at least in part on a duration of a power interruption caused by operation of the user interface. As discussed above, the processor may be particularly configured to respond to a predetermined duration of a power interruption by, for example, selecting one or more pre-programmed control signals stored in memory, modifying control signals generated by executing a lighting program, selecting and executing a new lighting program from memory, or otherwise affecting the radiation generated by one or more of the light sources.

FIG. 6 also illustrates that the lighting unit 100 may be configured to receive one or more signals 122 from one or more other signal sources 124. In one implementation, the processor 102 of the lighting unit may use the signal(s) 122, either alone or in combination with other control signals (e.g., signals generated by executing a lighting program, one or more outputs from a user interface, etc.), so as to control one or more of the light sources 104A, 104B and 104C in a manner similar to that discussed above in connection with the user interface.

Examples of the signal(s) 122 that may be received and processed by the processor 102 include, but are not limited to, one or more audio signals, video signals, power signals, various types of data signals, signals representing information obtained from a network (e.g., the Internet), signals representing one or more detectable/sensed conditions, signals from lighting units, signals consisting of modulated light, etc. In various implementations, the signal source(s) 124 may be located remotely from the lighting unit 100, or included as a component of the lighting unit. For example, in one embodiment, a signal from one lighting unit 100 could be sent over a network to another lighting unit 100.

Some examples of a signal source 124 that may be employed in, or used in connection with, the lighting unit 100 of FIG. 6 include any of a variety of sensors or transducers that generate one or more signals 122 in response to some stimulus. Examples of such sensors include, but are not limited to, various types of environmental condition sensors, such as thermally sensitive (e.g., temperature, infrared) sensors, humidity sensors, motion sensors, photosensors/light sensors (e.g., photodiodes, sensors that are sensitive to one or more particular spectra of electromagnetic radiation such as spectroradiometers or spectrophotometers, etc.), various types of cameras, sound or vibration sensors or other pressure/force transducers (e.g., microphones, piezoelectric devices), and the like.

Additional examples of a signal source 124 include various metering/detection devices that monitor electrical signals or characteristics (e.g., voltage, current, power, resistance, capacitance, inductance, etc.) or chemical/biological characteristics (e.g., acidity, a presence of one or more particular chemical or biological agents, bacteria, etc.) and provide one or more signals 122 based on measured values of the signals or characteristics. Yet other examples of a signal source 124 include various types of scanners, image recognition systems, voice or other sound recognition systems, artificial intelligence and robotics systems, and the like. A signal source 124 could also be a lighting unit 100, a processor 102, or any one of many available signal generating devices, such as media players, MP3 players, computers, DVD players, CD players, television signal sources, camera signal sources, microphones, speakers, telephones, cellular phones, instant messenger devices, SMS devices, wireless devices, personal organizer devices, and many others.

In one embodiment, the lighting unit 100 shown in FIG. 6 also may include one or more optical elements 130 to optically process the radiation generated by the light sources 104A, 104B, and 104C. For example, one or more optical elements may be configured so as to change one or both of a spatial distribution and a propagation direction of the generated radiation. In particular, one or more optical elements may be configured to change a diffusion angle of the generated radiation. In one aspect of this embodiment, one or more optical elements 130 may be particularly configured to variably change one or both of a spatial distribution and a propagation direction of the generated radiation (e.g., in response to some electrical and/or mechanical stimulus). Examples of optical elements that may be included in the lighting unit 100 include, but are not limited to, reflective materials, refractive materials, translucent materials, filters, lenses, mirrors, and fiber optics. The optical element 130 also may include a phosphorescent material, luminescent material, or other material capable of responding to or interacting with the generated radiation.

As also shown in FIG. 6, the lighting unit 100 may include one or more communication ports 120 to facilitate coupling of the lighting unit 100 to any of a variety of other devices. For example, one or more communication ports 120 may facilitate coupling multiple lighting units together as a networked lighting system, in which at least some of the lighting units are addressable (e.g., have particular identifiers or addresses) and are responsive to particular data transported across the network.

In particular, in a networked lighting system environment, as discussed in greater detail further below (e.g., in connection with FIG. 7), as data is communicated via the network, the processor 102 of each lighting unit coupled to the network may be configured to be responsive to particular data (e.g., lighting control commands) that pertain to it (e.g., in some cases, as dictated by the respective identifiers of the networked lighting units). Once a given processor identifies particular data intended for it, it may read the data and, for example, change the lighting conditions produced by its light sources according to the received data (e.g., by generating appropriate control signals to the light sources). In one aspect, the memory 114 of each lighting unit coupled to the network may be loaded, for example, with a table of lighting control signals that correspond with data the processor 102 receives. Once the processor 102 receives data from the network, the processor may consult the table to select the control signals that correspond to the received data, and control the light sources of the lighting unit accordingly.

In one aspect of this embodiment, the processor 102 of a given lighting unit, whether or not coupled to a network, may be configured to interpret lighting instructions/data that are received in a DMX protocol (as discussed, for example, in U.S. Pat. Nos. 6,016,038 and 6,211,626), which is a lighting command protocol conventionally employed in the lighting industry for some programmable lighting applications. For example, in one aspect, a lighting command in DMX protocol may specify each of a red channel control signal, a green channel control signal, and a blue channel control signal as an eight-bit digital signal representing a number from 0 to 255, wherein the maximum value of 255 for any one of the color channels instructs the processor 102 to control the corresponding light source(s) to generate the maximum available radiant power for that color (such a command structure is commonly referred to as 24-bit color control). Hence, a command of the format [R, G, B]=[255, 255, 255] would cause the lighting unit to generate maximum radiant power for each of red, green and blue light (thereby creating white light). It should be appreciated, however, that lighting units suitable for purposes of the present disclosure are not limited to a DMX command format, as lighting units according to various embodiments may be configured to be responsive to other types of communication protocols so as to control their respective light sources.

In one embodiment, the lighting unit 100 of FIG. 6 may include and/or be coupled to one or more power sources 108. In various aspects, examples of power source(s) 108 include, but are not limited to, AC power sources, DC power sources, batteries, solar-based power sources, thermoelectric or mechanical-based power sources and the like. Additionally, in one aspect, the power source(s) 108 may include or be associated with one or more power conversion devices that convert power received by an external power source to a form suitable for operation of the lighting unit 100.

While not shown explicitly in FIG. 6, the lighting unit 100 may be implemented in any one of several different structural configurations according to various embodiments of the present disclosure. Examples of such configurations include, but are not limited to, an essentially linear or curvilinear configuration, a circular configuration, an oval configuration, a rectangular configuration, combinations of the foregoing, various other geometrically shaped configurations, various two or three dimensional configurations, and the like.

A given lighting unit also may have any one of a variety of mounting arrangements for the light source(s), enclosure/housing arrangements and shapes to partially or fully enclose the light sources, and/or electrical and mechanical connection configurations. In particular, a lighting unit may be configured as a replacement or "retrofit" to engage electrically and mechanically in a conventional socket or fixture arrangement (e.g., an Edison-type screw socket, a halogen fixture arrangement, a fluorescent fixture arrangement, etc.).

Additionally, one or more optical elements as discussed above may be partially or fully integrated with an enclosure/housing arrangement for the lighting unit. Furthermore, a given lighting unit optionally may be associated with (e.g., include, be coupled to and/or packaged together with) various other components (e.g., control circuitry such as the processor and/or memory, one or more sensors/transducers/signal sources, user interfaces, displays, power sources, power conversion devices, etc.) relating to the operation of the light source(s).

Figure 7:
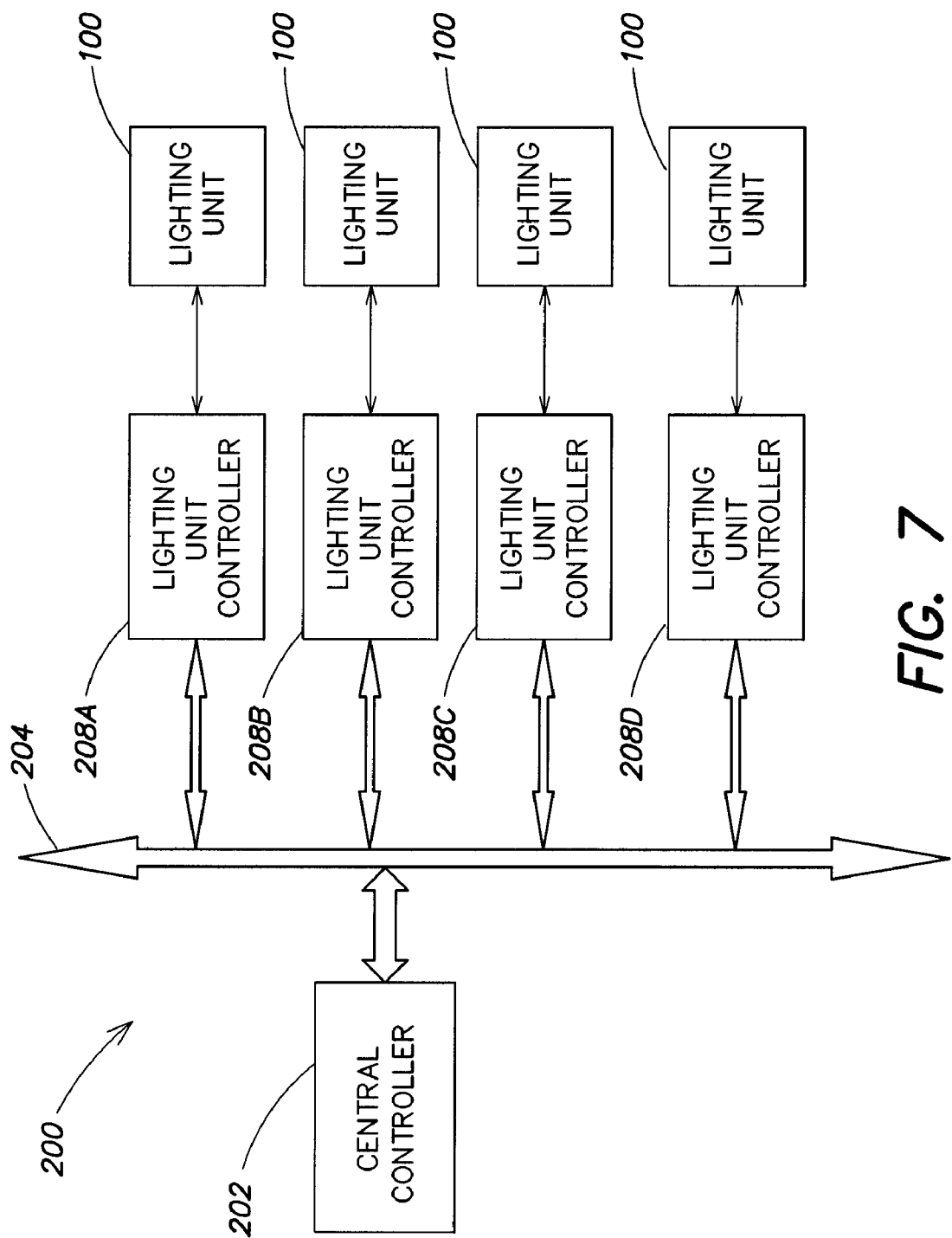
FIG. 7 is a diagram illustrating a networked lighting system according to one embodiment of the disclosure.

FIG. 7 illustrates an example of a networked lighting system 200 according to one embodiment of the present disclosure. In the embodiment of FIG. 7, a number of lighting units 100, similar to those discussed above in connection with FIG. 6, are coupled together to form the networked lighting system. It should be appreciated, however, that the particular configuration and arrangement of lighting units shown in FIG. 7 is for purposes of illustration only, and that the disclosure is not limited to the particular system topology shown in FIG. 7.

Additionally, while not shown explicitly in FIG. 7, it should be appreciated that the networked lighting system 200 may be configured flexibly to include one or more user interfaces, as well as one or more signal sources such as sensors/transducers. For example, one or more user interfaces and/or one or more signal sources such as sensors/transducers (as discussed above in connection with FIG. 6) may be associated with any one or more of the lighting units of the networked lighting system 200. Alternatively (or in addition to the foregoing), one or more user interfaces and/or one or more signal sources may be implemented as "stand alone" components in the networked lighting system 200. Whether stand alone components or particularly associated with one or more lighting units 100, these devices may be "shared" by the lighting units of the networked lighting system. Stated differently, one or more user interfaces and/or one or more signal sources such as sensors/transducers may constitute "shared resources" in the networked lighting system that may be used in connection with controlling any one or more of the lighting units of the system.

As shown in the embodiment of FIG. 7, the lighting system 200 may include one or more lighting unit controllers (hereinafter "LUCs") 208A, 208B, 208C, and 208D, wherein each LUC is responsible for communicating with and generally controlling one or more lighting units 100 coupled to it. Although FIG. 7 illustrates one lighting unit 100 coupled to each LUC, it should be appreciated that the disclosure is not limited in this respect, as different numbers of lighting units 100 may be coupled to a given LUC in a variety of different configurations (serially connections, parallel connections, combinations of serial and parallel connections, etc.) using a variety of different communication media and protocols.

In the system of FIG. 7, each LUC in turn may be coupled to a central controller 202 that is configured to communicate with one or more LUCs. Although FIG. 7 shows four LUCs coupled to the central controller 202 via a generic connection 204 (which may include any number of a variety of conventional coupling, switching and/or networking devices), it should be appreciated that according to various embodiments, different numbers of LUCs may be coupled to the central controller 202. Additionally, according to various embodiments of the present disclosure, the LUCs and the central controller may be coupled together in a variety of configurations using a variety of different communication media and protocols to form the networked lighting system 200. Moreover, it should be appreciated that the interconnection of LUCs and the central controller, and the interconnection of lighting units to respective LUCs, may be accomplished in different manners (e.g., using different configurations, communication media, and protocols).

For example, according to one embodiment of the present disclosure, the central controller 202 shown in FIG. 7 may by configured to implement Ethernet-based communications with the LUCs, and in turn the LUCs may be configured to implement DMX-based communications with the lighting units 100. In particular, in one aspect of this embodiment, each LUC may be configured as an addressable Ethernet-based controller and accordingly may be identifiable to the central controller 202 via a particular unique address (or a unique group of addresses) using an Ethernet-based protocol. In this manner, the central controller 202 may be configured to support Ethernet communications throughout the network of coupled LUCs, and each LUC may respond to those communications intended for it. In turn, each LUC may communicate lighting control information to one or more lighting units coupled to it, for example, via a DMX protocol, based on the Ethernet communications with the central controller 202.

More specifically, according to one embodiment, the LUCs 208A, 208B, and 208C shown in FIG. 7 may be configured to be "intelligent" in that the central controller 202 may be configured to communicate higher level commands to the LUCs that need to be interpreted by the LUCs before lighting control information can be forwarded to the lighting units 100. For example, a lighting system operator may want to generate a color changing effect that varies colors from lighting unit to lighting unit in such a way as to generate the appearance of a propagating rainbow of colors ("rainbow chase"), given a particular placement of lighting units with respect to one another. In this example, the operator may provide a simple instruction to the central controller 202 to accomplish this, and in turn the central controller may communicate to one or more LUCs using an Ethernet-based protocol high level command to generate a "rainbow chase." The command may contain timing, intensity, hue, saturation or other relevant information, for example. When a given LUC receives such a command, it may then interpret the command and communicate further commands to one or more lighting units using a DMX protocol, in response to which the respective sources of the lighting units are controlled via any of a variety of signaling techniques (e.g., PWM).

It should again be appreciated that the foregoing example of using multiple different communication implementations (e.g., Ethernet/DMX) in a lighting system according to one embodiment of the present disclosure is for purposes of illustration only, and that the disclosure is not limited to this particular example.

Figure 1:
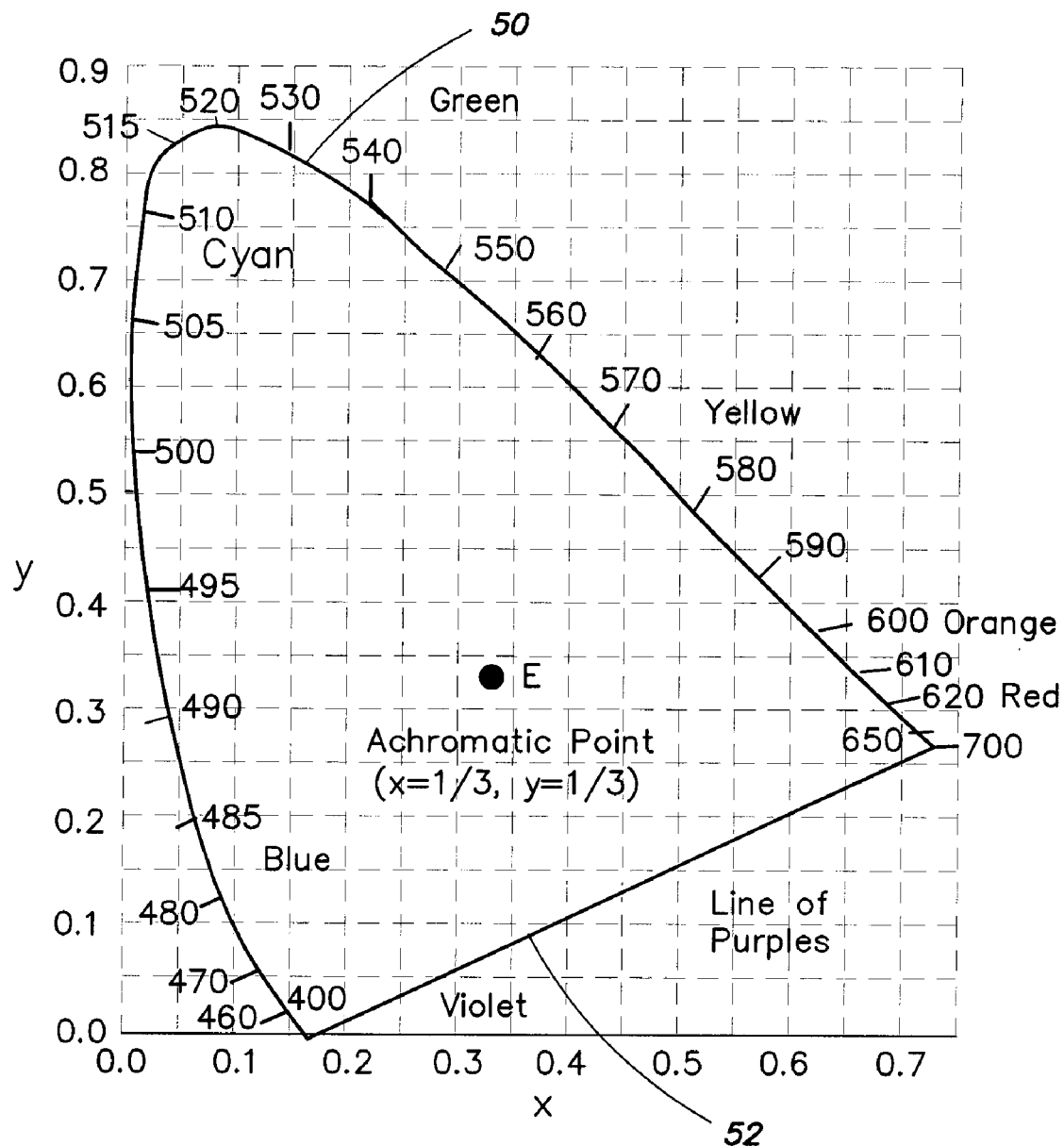
FIG. 1 illustrates the conventional CIE Chromaticity Diagram.
Figure 2:
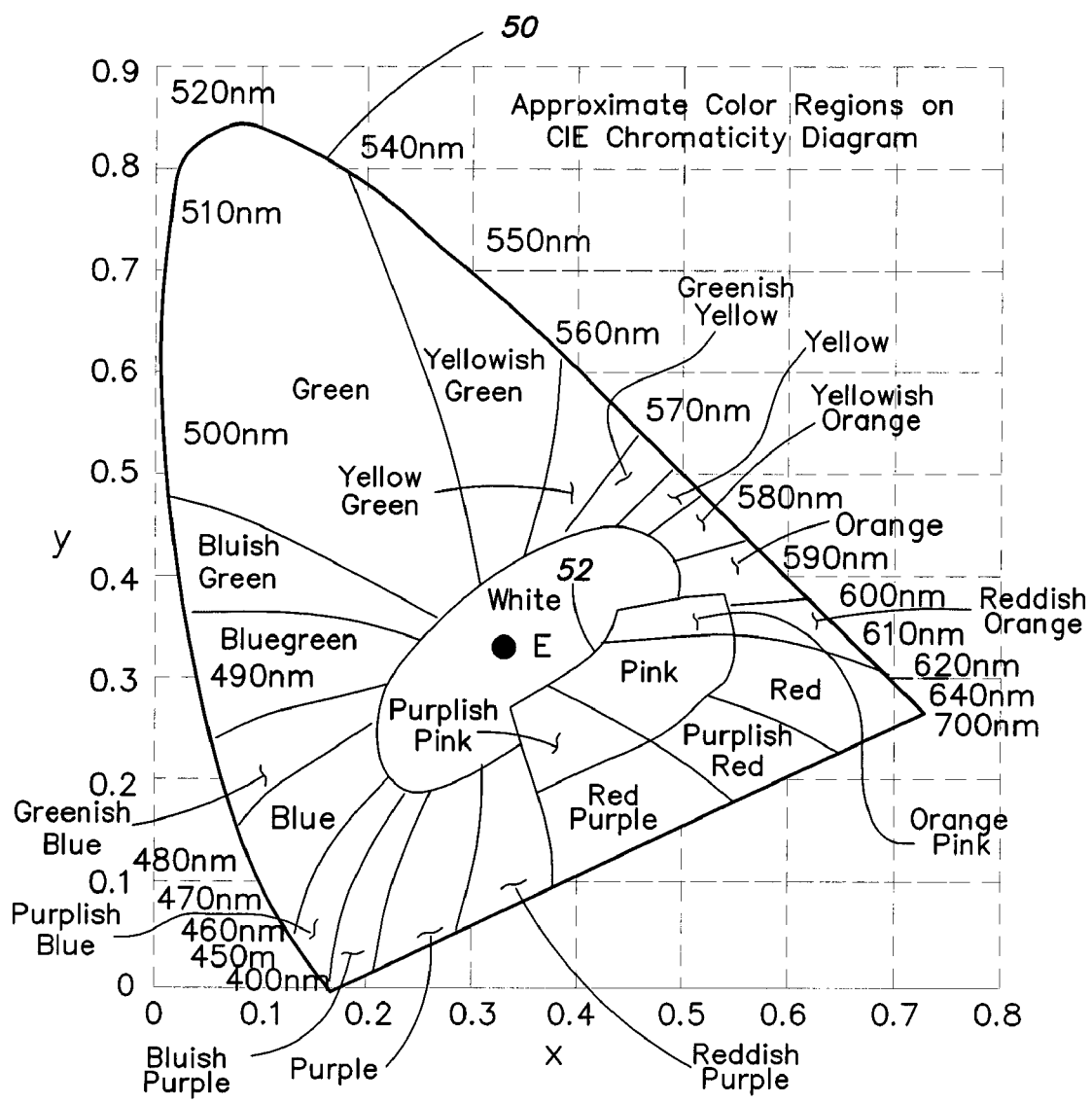
FIG. 2 illustrates the diagram of FIG. 1, with approximate color categorizations indicated thereon.
Figure 3:
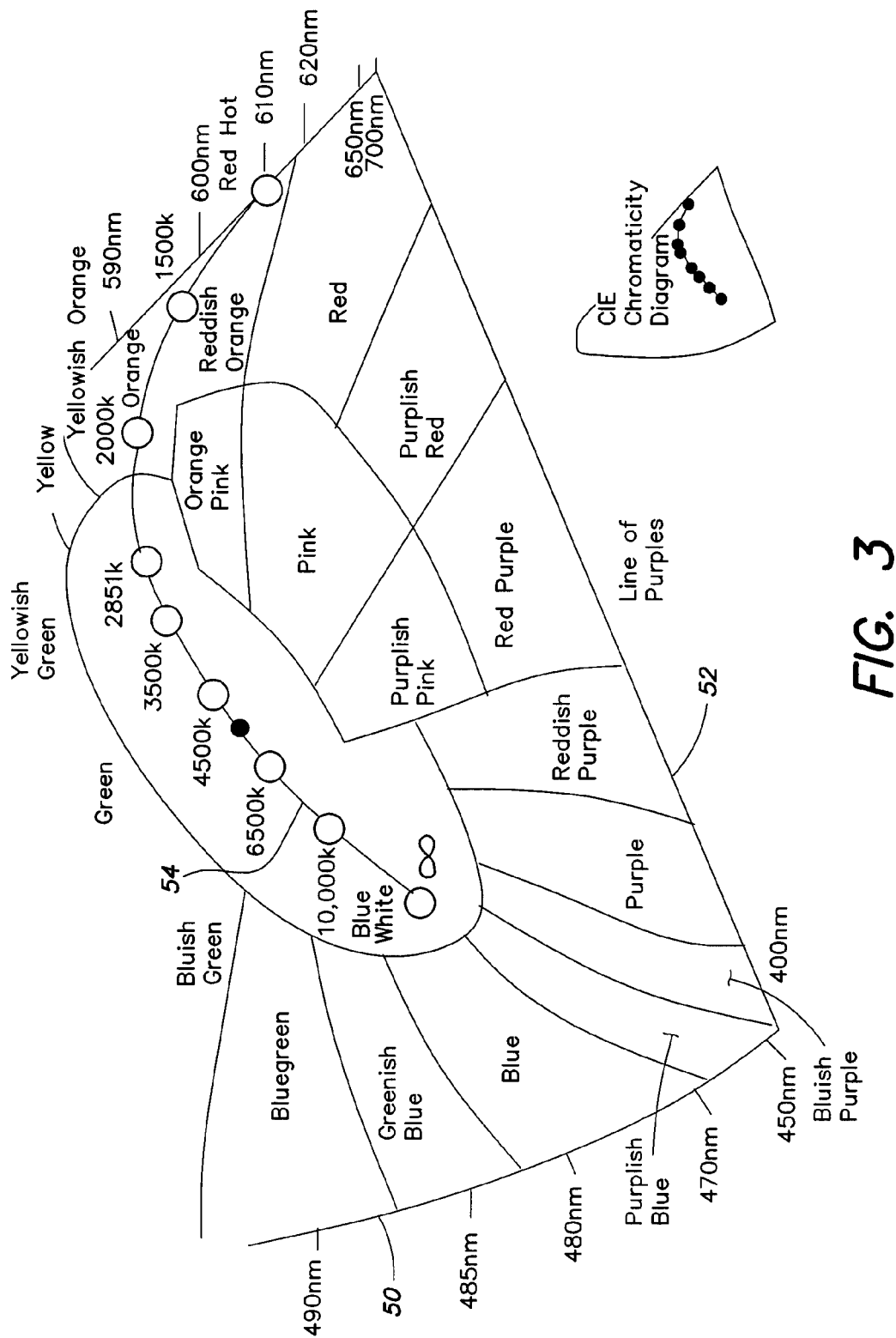
FIG. 3 illustrates a portion of the diagram of FIG. 2, onto which is mapped a white light/black body curve representing color temperatures of white light.
Figure 4:
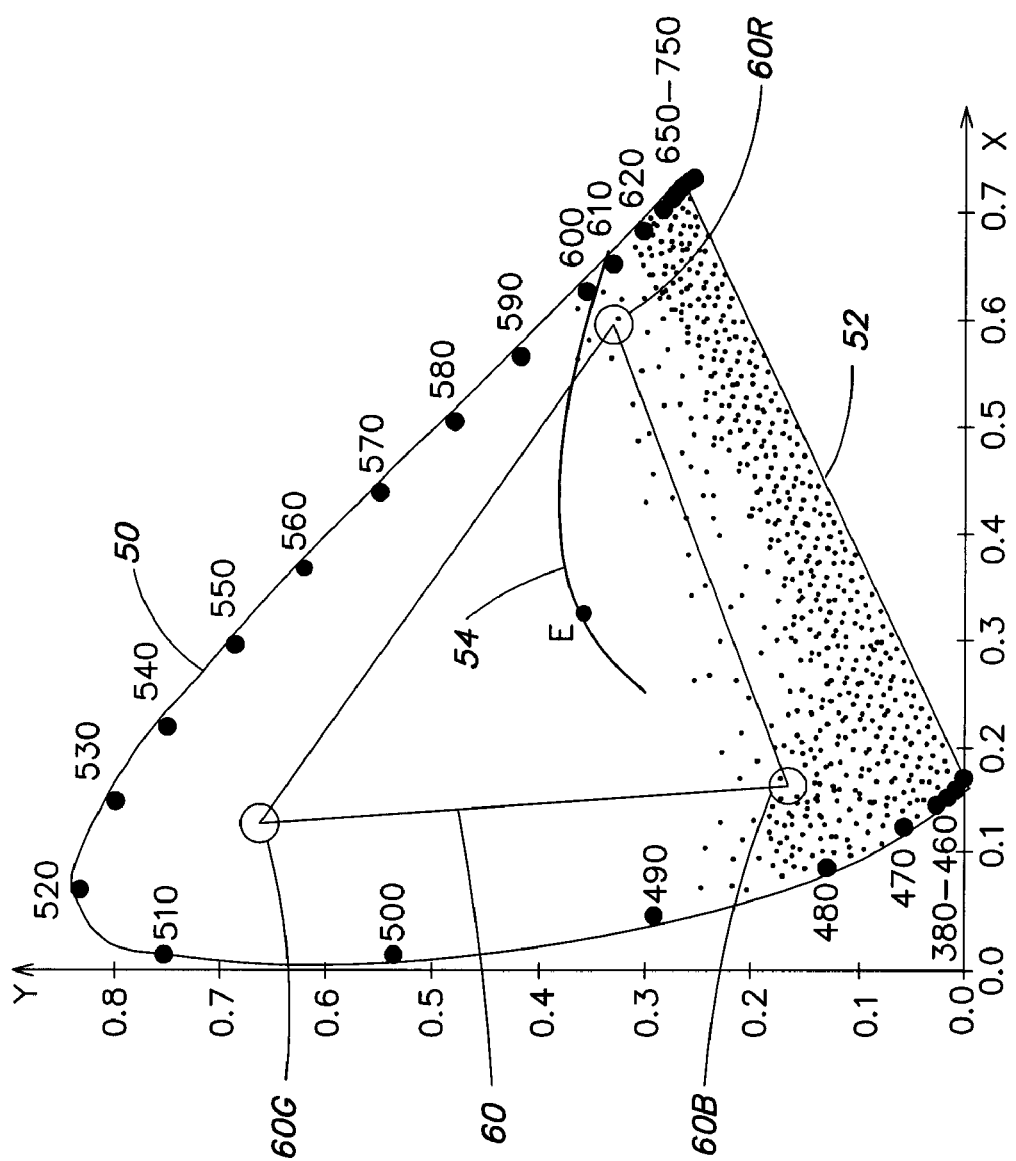
FIG. 4 illustrates the diagram of FIG. 1, onto which is mapped a color gamut corresponding to a first exemplary lighting unit including red, green and blue light sources.
Figure 5:
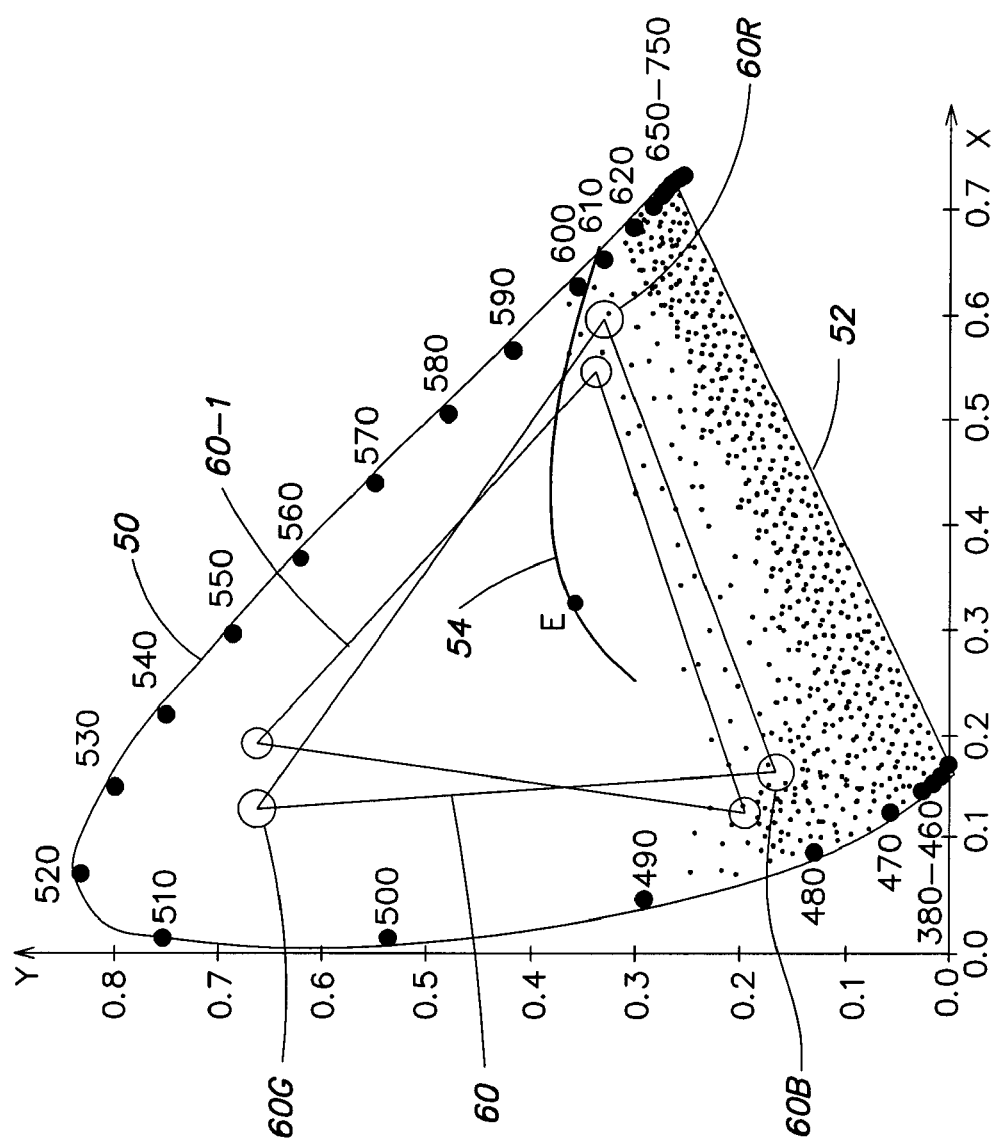
FIG. 5 illustrates the diagram of FIG. 4, onto which is mapped a second color gamut corresponding to a second exemplary lighting unit including different red, green and blue light sources.

From the foregoing, it may be appreciated that one or more lighting units as discussed above are capable of generating highly controllable variable color light over a wide range of colors, as well as variable color temperature white light over a wide range of color temperatures. However, as discussed above, different lighting units in some cases may not be capable of generating substantially the same range of colors or color temperatures of light even though the lighting units employ generally similar light sources (e.g., same color sets of LEDs). Moreover, if two or more such lighting units receive lighting instructions (e.g. lighting commands) intended to cause the generation of the same color (or color temperature) of light from both units, each lighting unit may in fact generate a perceivably different color (or color temperature) of light, based at least in part on respective different color gamuts associated with the lighting units. Such a situation initially was discussed above in connection with FIG. 5.

More specifically, consider two LED-based lighting units 100 as discussed above in which three different color LEDs are employed in each lighting unit to represent the primary colors (e.g., red LEDs, blue LEDs and green LEDs). Each of the red LEDs in the two lighting units may not have exactly the same dominant wavelength, FWHM, or overall spectrum; similarly, each of the green LEDs in the two lighting units may not have the same dominant wavelength, FWHM, or overall spectrum, and each of the blue LEDs in the two lighting units may not have the same dominant wavelength, FWHM, or overall spectrum. In particular, LEDs of a given specified color generally are available over a range of dominant wavelengths and may have somewhat different spectrums (e.g., different manufacturers, or even the same manufacturer, may produce a given color LED at somewhat different dominant wavelengths over some specified range). Exemplary approximate dominant wavelengths for commonly available red, green and blue LEDs include 615-635 nanometers for red LEDs, 515-535 nanometers for green LEDs, and 460-475 nanometers for blue LEDs.

Now consider that each exemplary lighting unit may have one red LED or multiple red LEDs having a variety of subtly different spectrums, one green LED or multiple green LEDs having a variety of subtly different spectrums, and one blue LED or multiple blue LEDs having a variety of subtly different spectrums. Thus, whether or not a lighting unit has one LED or multiple LEDs of a given color, the spectral power distributions (SPDs) of each of the red light, green light and blue light from a given lighting unit, based on energizing one or more red LEDs, one or more green LEDs, and one or more blue LEDs, very likely will be different than the corresponding SPDs of another lighting unit, based on the variety of possible spectrums associated with the individual LED sources of the lighting units.

Figure 8:
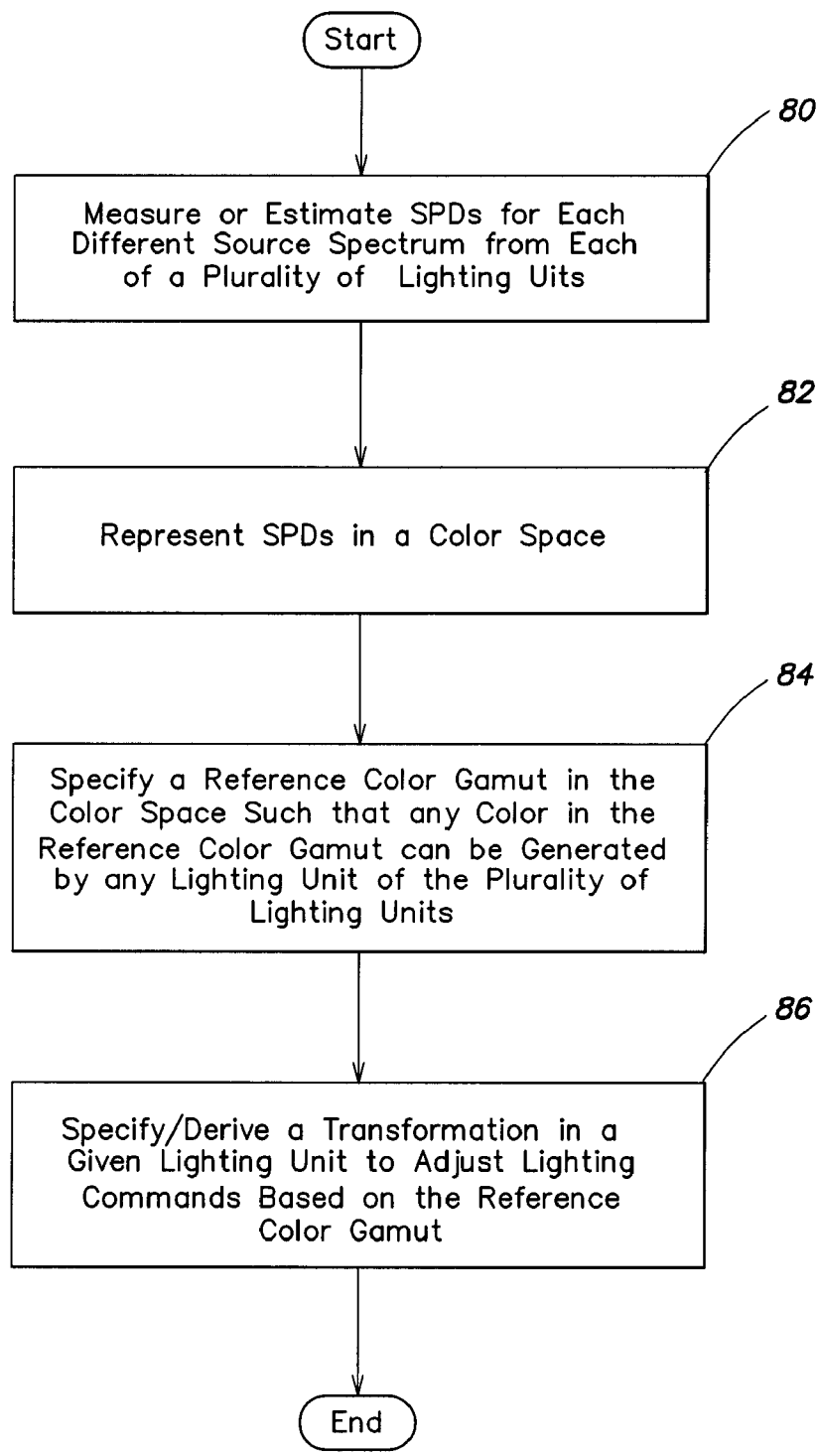
FIG. 8 is a flow chart illustrating a method according to one embodiment of the disclosure for determining a reference color gamut for multiple lighting units, and determining/specifying a transformation for lighting commands in a given lighting unit based on the reference color gamut.

To address the foregoing situation, various embodiments of the present disclosure are directed to methods for determining a reference color gamut that is shared amongst multiple lighting units. FIG. 8 is a flow chart illustrating one such method. In one exemplary implementation, the processor 102 of one or more lighting units similar to those shown in FIGS. 6 and 7 may be appropriately configured (e.g., programmed) to implement all or a portion of the method outlined in FIG. 8. In other implementations, a reference color gamut may be determined according to the method of FIG. 8 by any of a variety of means, including one or more independent processors programmed to implement all or a portion of the method outlined in FIG. 8, after which a representation of the reference color gamut may be downloaded to the processor 102 of one or more lighting units and stored, for example, in the memory 114.

In FIG. 8, as indicated in block 80, first a spectral power distribution (SPD) may be measured or estimated for each different source spectrum from each of a plurality of lighting units. In one exemplary implementation, two or more lighting units are selected to form a "sample space" of lighting units from which the reference color gamut ultimately is derived, and an SPD is measured or estimated for each different spectrum from each lighting unit of the sample space. As discussed further below, it should be appreciated that lighting units not included in a given sample space nonetheless may be configured to generate light based on a reference color gamut derived from the given sample space.

For purposes of an initial discussion of the method outlined in FIG. 8, we consider a sample space of three exemplary lighting units 100, wherein each lighting unit again includes one or more red LEDs, one or more green LEDs, and one or more blue LEDs. With the foregoing in mind, pursuant to block 80 of FIG. 8, an SPD may be measured (by an appropriate measuring instrument) for red light (generated by a red LED or a group of red LEDs energized together), green light (generated by a green LED or a group of green LEDs energized together), and blue light (generated by a blue LED or a group of blue LEDs energized together) from each lighting unit in the sample space of three lighting units to provide nine SPDs. Alternatively, an SPD may be assumed for each different spectrum from each of the lighting units of the sample space (e.g., based on an expected/approximate dominant wavelength, FWHM, and radiant power). In one aspect of this embodiment, all of the nine SPDs are measured (or estimated) at maximum available radiant powers for the respective spectrums.

For some applications, whether the SPDs are measured or estimated, it may be desirable to take into account one or more intervening surfaces between the generated light and an anticipated point of perception of the light. For example, consider an application in which each of the three lighting units are positioned so as to illuminate one or more walls of a room, and the light generated by the three units generally is perceived in the room after the light has reflected off of the wall(s). Based on the physical properties of the material constituting the wall(s), including possible wall coverings such as paints, wallpapers, etc., the light reflected from the wall(s) and ultimately perceived may have an appreciably different SPD than the light impinging on the wall(s). More specifically, the wall(s) (or any other intervening surface) may absorb/reflect each of the source spectrums (e.g., the red, green and blue light) somewhat differently. In view of the foregoing, in one embodiment some or all of the SPDs may be measured, estimated, or specifically modeled to include the effects of one or more intervening surfaces that may be present in a given application, so as to take into account light-surface interactions in the determination of a reference color gamut.

Once the SPDs are determined (e.g., in any of the manners discussed above), as indicated in block 82 of FIG. 8 they may be represented on some color space or color model for categorizing color. As discussed above in connection with FIG. 1, the CIE color system provides one conventional example of a useful construct for categorizing color, via the CIE chromaticity diagram for example. While the discussion below focuses on the CIE color system (and, in particular, the CIE chromaticity diagram) as an exemplary color space, again it should be appreciated that the concepts disclosed herein generally are applicable to any of a variety of constructs used to describe a color model, space, or system that may be employed to facilitate a determination of a reference color gamut.

Figure 9:
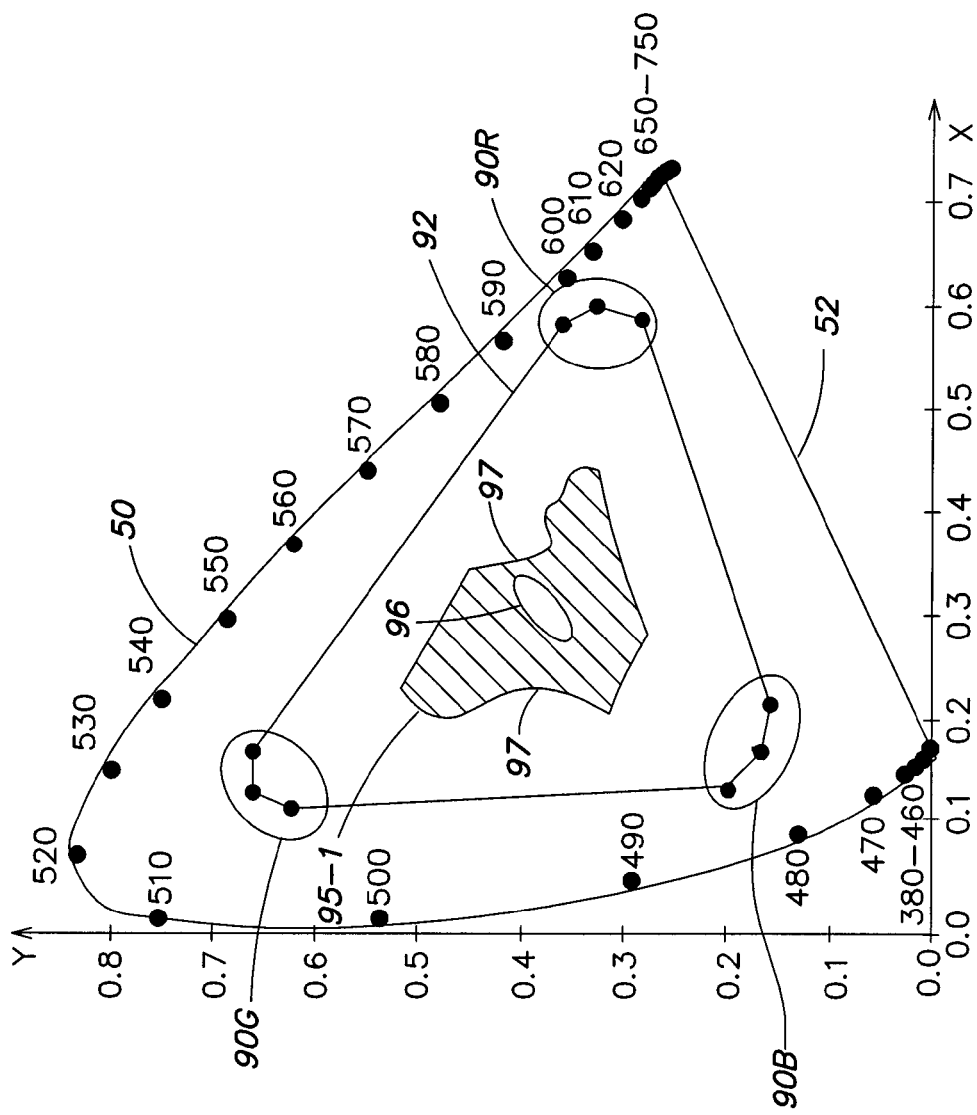
FIG. 9 is a diagram illustrating the CIE chromaticity diagram of FIG. 1, showing points representing spectral power distributions SPDs from multiple lighting units and an exemplary reference color gamut, according to one embodiment of the disclosure.

In view of the foregoing, in one exemplary implementation of the method outlined in FIG. 8, CIE chromaticity coordinates x,y may be calculated in the manner described above in connection with FIG. 1 and plotted on the CIE chromaticity diagram for each different source spectrum from each of lighting units of the sample space. FIG. 9 illustrates the CIE chromaticity diagram of FIG. 1, onto which are mapped the x,y chromaticity coordinates corresponding to each of the nine SPDs associated with the sample space, to provide nine points on the diagram. In particular, as illustrated in FIG. 9, three points corresponding to the red light from each fixture constitute a red "point cloud" 90R, three points corresponding to the green light from each fixture constitute a green point cloud 90G, and three points corresponding to the blue light from each fixture constitute a blue point cloud 90B. It should be appreciated that the distributions of the points contained in the point clouds shown in FIG. 9 are provided primarily for purposes of illustrating some of the salient concepts underlying the method of FIG. 8, and that point clouds corresponding to any given sample space of lighting units may be more or less distributed than those shown in FIG. 9.

As indicated in block 84, according to the method of FIG. 8 a reference color gamut is specified in the color space (e.g., on the CIE chromaticity diagram) such that any color that is included in the reference color gamut can be generated by any lighting unit in the sample space. According to various embodiments, this may be accomplished in a number of ways.

For example, in one embodiment, once points corresponding to the SPDs are plotted on the CIE diagram, a polygon formed on the diagram by the points may be determined by connecting at least some of the points by straight lines. In FIG. 9, one example of such a polygon 92 is shown, in which all of the plotted points are used to form the polygon, wherein each of the points lies at a vertex of the polygon. It should be appreciated, however, that in other embodiments, it may not be necessary to use all of the plotted points to form the polygon. In particular, according to one embodiment (e.g., as discussed below in connection with FIG. 12), a largest possible polygon formed on the CIE diagram is determined by connecting only some of the plotted points by straight lines, wherein each vertex of the polygon corresponds to only one SPD in a given point cloud (stated differently, each vertex of the resulting polygon corresponds to a different source spectrum from only one of the lighting units in the sample space).

Once a polygon is determined in some manner based on at least some plotted points, a reference color gamut may be specified as at least one region smaller than and within the polygon. Again, according to one embodiment, a guiding principle for selecting a reference color gamut is that all of the lighting units in the sample space are capable of generating any color included in the reference color gamut. This may be accomplished in any of a variety of ways, resulting in a variety of possible reference color gamuts having different shapes and configurations. To this end, FIG. 9 also shows an arbitrarily shaped reference color gamut 95-1 specified as a shaded region smaller than and within the polygon 92. It should be appreciated that the exemplary gamut 95-1 shown in FIG. 9 may or may not represent a practically desirable reference gamut, and that it is provided primarily for purposes of illustrating various aspects of possible reference gamut configurations for representing colors that may be generated by any of the lighting units in the sample space.

In various embodiments, a reference color gamut may be a smaller polygon having a same or different shape, and/or a same or different number of vertices as the initially determined polygon (e.g., the polygon 92). Likewise, as shown in FIG. 9, a reference color gamut may have a perimeter including one or more curved portions 97. Additionally, a reference color gamut may be specified so as to enclose a second region 96 that is not included in the reference color gamut, so as to form a sort of "donut" (however oddly shaped), with the region 96 essentially serving as a "donut hole." In such a "donut" configuration, while all of the lighting units of the sample space theoretically may be capable of generating colors within the donut hole region 96, a donut reference color gamut thusly specified intentionally precludes one or more lighting units using the donut reference gamut from generating some color or range of colors falling within the donut hole region. Such an intentional preclusion of possible color generation may be desirable for a given application (e.g., a lighting system designer may want to intentionally preclude the generation of relatively unsaturated colors in some area around the white light/black body curve, and accordingly specifies a reference color gamut that may include a "donut hole" around, or otherwise avoids, the white light/black body curve).

In yet another embodiment, a reference color gamut may be specified to cover a significantly small specific region, intentionally much smaller than the largest region of the CIE diagram including all of the colors that are reproducible by all of the lighting units of the sample space. Such a reference color gamut restricts the overall dynamic range of colors that a lighting unit employing the reference color gamut can generate. However, an intentionally restricted reference color gamut in turn may afford a higher degree of control over color generation within the gamut (i.e., a higher precision or resolution of color control) without requiring any change in the format of lighting commands. For example, for lighting units employing a 24-bit command format (i.e., eight bits for each of the red, green and blue source spectrums to specify relative proportions of the spectrums), an intentionally restricted gamut affords a higher degree of control over color generation based on an eight-bit per spectrum-channel command format than would an appreciably larger gamut. Again, such higher precision control may be particularly desirable for a given application.

In general, a variety of relatively trivial or complex reference color gamuts may be specified for a variety of applications. In some instances, more complex or esoteric reference color gamuts (or even relatively trivial gamuts) may be determined and/or specified via some mathematical model, formula, algorithm, etc. Mathematical derivations or specifications of a reference color gamut may take into consideration not only the chromaticity coordinates corresponding to the SPDs of light generated by the lighting units of the sample space, as shown in FIG. 9, but other factors as well, such as the luminance associated with each of the SPDs (e.g., the CIE Y tristimulus value discussed above in connection with FIG. 1). In this manner, the derivation or specification of a reference color gamut may be viewed as a multidimensional analysis involving two, three (e.g., the three tristimulus values X, Y, and Z in the CIE color space), or even more parameters. More generally, multidimensional derivations or specifications of a reference color gamut, mathematical or otherwise, may be based on color models/spaces/systems other than the CIE system, as discussed above.

Figure 10:
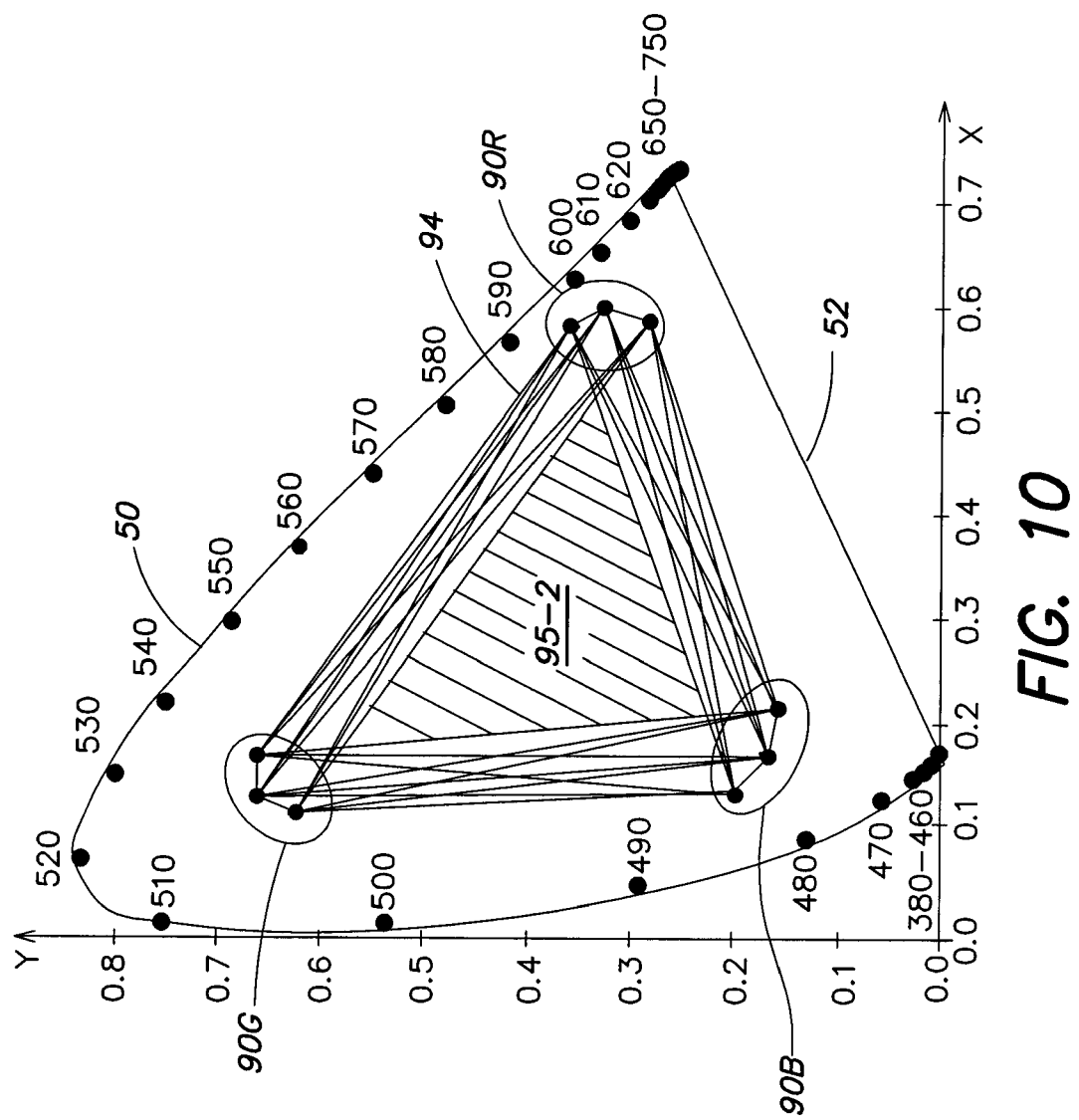
FIG. 10 is a diagram similar to that shown in FIG. 9, illustrating the determination of a reference color gamut according to another embodiment of the disclosure.

FIG. 10 illustrates the determination of a reference color gamut 95-2 according to another embodiment of the present disclosure. As in FIG. 9, we continue to consider the example of the sample space including three lighting units, each unit capable of generating red, green and blue source spectrums. Accordingly, the red point cloud 90R, the green point cloud 90G, and the blue point cloud 90B, each including three points, are indicated again in FIG. 10.

In the embodiment of FIG. 10, each point in each point cloud is connected to all other points in other point clouds via a plurality of straight lines 94. In the exemplary sample space of three lighting units, this implies that each point in the diagram of FIG. 10 has six lines emanating from it, i.e., one group of three lines connecting the point to the three points in a first of the other two point clouds, and another group of three lines connecting the point to the three points in a second of the other two point clouds. The resulting plurality of lines 94 illustrated in FIG. 10 represents a collection of all possible gamuts for a theoretical lighting unit that may arbitrarily include any one of the red, green and blue light sources from the entire sample space. Based on such a collection of gamuts, the reference color gamut 95-2 is specified in this embodiment as a largest enclosed region of the CIE diagram that is not bisected by any of the straight lines 94 and having a perimeter delineated by at least some of the straight lines.

Figure 11:
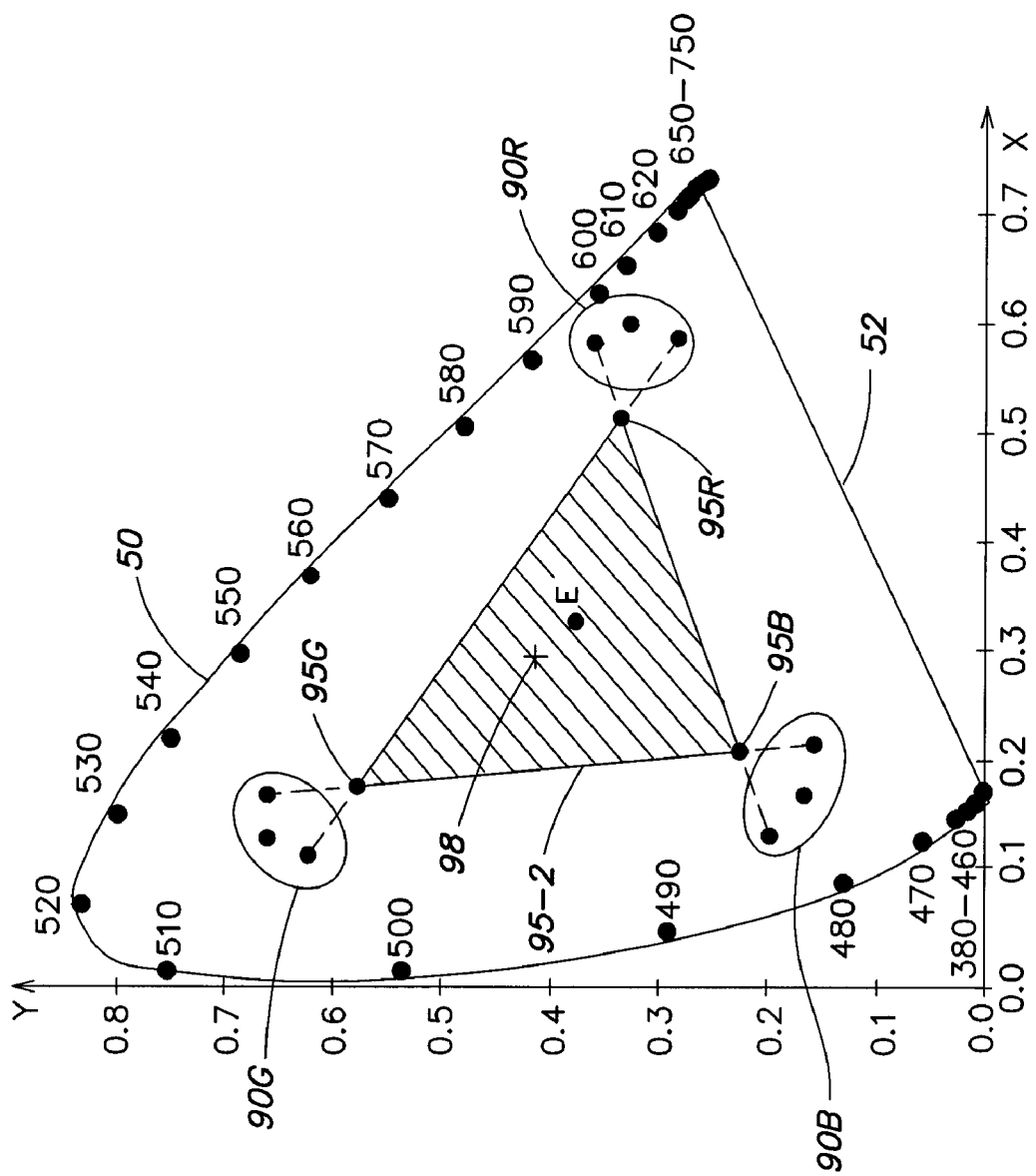
FIG. 11 is a diagram similar to that shown in FIG. 10, illustrating the reference color gamut and its associated vertices resulting from the method discussed in connection with FIG. 10, according to one embodiment of the disclosure.

FIG. 11 is a diagram similar to that shown in FIG. 10, illustrating more clearly the resulting triangular reference color gamut 95-2 and its associated vertices 95R, 95G, and 95B based on the method discussed above in connection with FIG. 10. The determination of the reference color gamut 95-2 in essence is based on a "worse case" scenario involving different possible pairs of source spectrums from the lighting units of the sample space. In particular, FIG. 11 illustrates, via dashed line extensions from the reference color gamut vertices 95R, 95G and 95B, connections between pairs of points in different clouds that, if associated with a same lighting unit, would result in the most restrictive gamut. In this manner, the reference color gamut 95-2 of this embodiment ensures that any lighting unit in the sample space can recreate any color included in the reference color gamut 95-2. In view of the foregoing, it should be appreciated in the embodiment illustrated in FIGS. 10 and 11 that, in one aspect, more "tightly packed" point clouds 90R, 90G and 90B, each covering as small as possible an area of the CIE chromaticity diagram, may be particularly desirable to ensure the largest possible reference color gamut 95-2.

Figure 12:
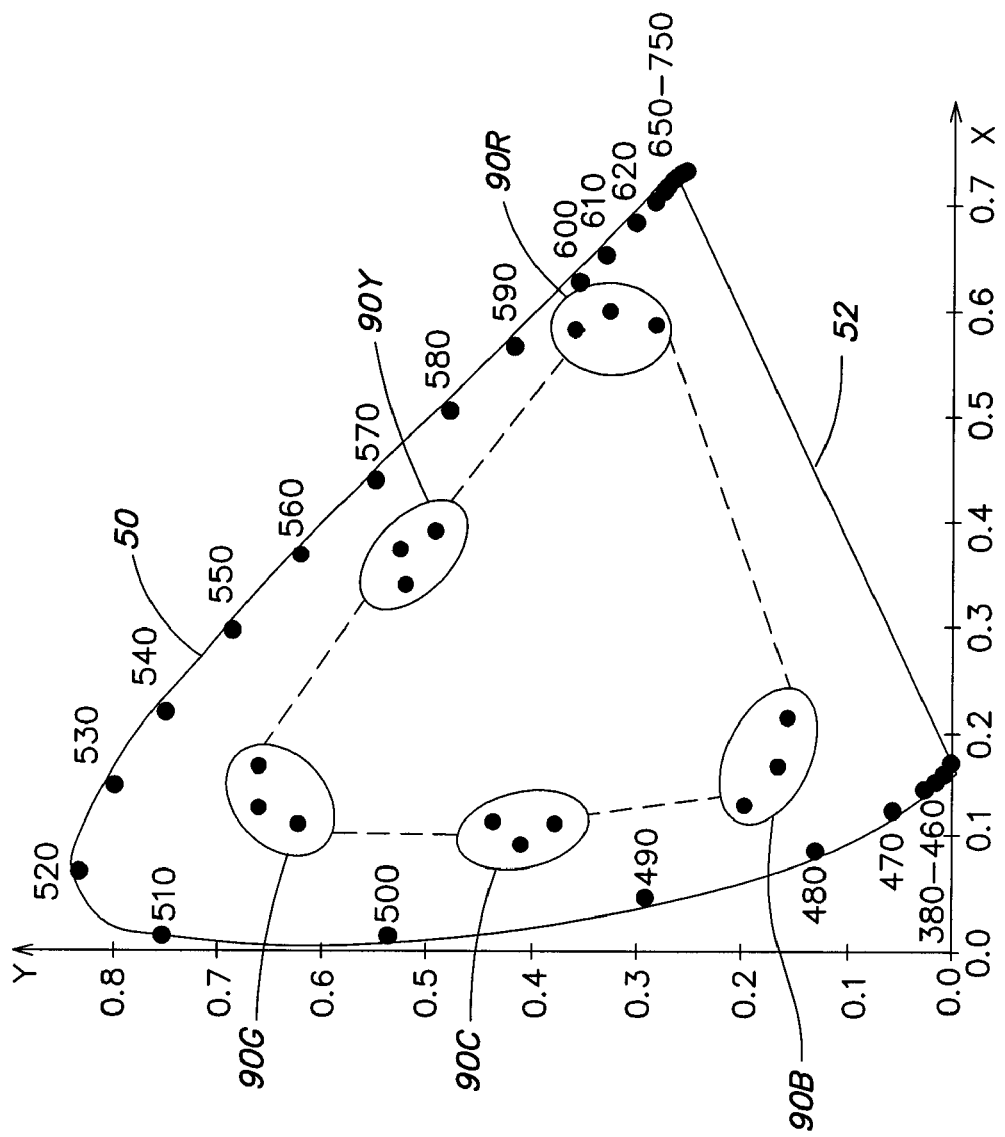
FIG. 12 is a diagram illustrating the CIE chromaticity diagram of FIG. 1, showing points representing spectral power distributions from multiple lighting units according to another embodiment of the disclosure, in which multiple point clouds form a polygon on the CIE diagram.

The process outlined above in connection with FIGS. 10 and 11 similarly may be implemented for sample spaces of lighting units in which each lighting unit is capable of generating more than three spectrums, thereby giving rise to more than three point clouds on the CIE chromaticity diagram. For example, a CIE chromaticity diagram representing a sample space including lighting units having five different source spectrums is illustrated in FIG. 12. In particular, consider a sample space in which, in addition to red, green and blue sources, the lighting units include yellow and cyan sources. Accordingly, in addition to the point clouds 90R (red), 90G (green) and 90B (blue), FIG. 12 shows an additional point cloud 90Y representing the yellow sources of the sample space, as well as an additional point cloud 90C representing the cyan sources of the sample space. Again, it should be appreciated that the exact placement of the various points on the diagram of FIG. 12 may not precisely indicate the sources of any particular sample space, and that the arrangement of points is provided primarily for purposes of illustration.

In FIG. 12, a number of dashed lines are also indicated to connect "neighboring" point clouds so as to form the largest possible polygon in the CIE diagram based on the point clouds. In essence, such a polygon constitutes a "convex hull" for the set of point clouds (i.e., the smallest convex set that includes the all of the point clouds). Based on such a polygon, the process discussed above in connection with FIG. 10 may be implemented, wherein each point in each point cloud is connected to all other points in its two neighboring point clouds via a plurality of straight lines (to preserve clarity in the figure, these lines are not drawn in FIG. 12). For example, each point in the cyan point cloud 90C would be connected to all other points in the green point cloud 90G and the blue point cloud 90B (and similar interconnections between neighbors would be carried out for the other point clouds). In the exemplary sample space of three lighting units, this again implies that each point in the diagram of FIG. 12 would have six lines emanating from it, i.e., one group of three lines connecting the point to the three points in a first neighbor point cloud, and another group of three lines connecting the point to the three points in a second neighbor point cloud.

As in FIG. 10, the plurality of lines resulting from such an interconnection of points in FIG. 12 would represent a collection of all possible gamuts for a theoretical lighting unit that may arbitrarily include any one of the red, green and blue, yellow and cyan light sources from the entire sample space. Based on such a collection of gamuts, a reference color gamut may be specified according to this embodiment, as in FIG. 10, as a largest enclosed region of the CIE diagram that is not bisected by any of the interconnecting lines and having a perimeter delineated by at least some of the lines. Again, the determination of the reference color gamut in this manner in essence is based on a "worse case" scenario involving different possible pairs of source spectrums from the lighting units of the sample space.

Once a reference color gamut is determined or specified according to any of various embodiments of the present disclosure, a transformation may be derived or specified in any given lighting unit to adjust lighting commands received by the lighting unit based on the reference color gamut, as indicated in block 86 of FIG. 8. In addition to reference color gamuts determined according to various embodiments discussed above, a reference color gamut for one or more lighting units may be specified according to any of a variety of predetermined (e.g., industry-specified) color gamuts in large part established in connection with computer environments, television broadcasting and video reproduction, and photographic reproduction, for example, so as to control various color reproducing devices (e.g., displays, monitors, televisions, printers, scanners, digital cameras, etc.). Predetermined color gamuts may be specified for a particular color reproducing device or a family of color reproducing devices (e.g., computer monitors, printers). Some exemplary industry-specified color gamuts (also referred to in some of the relevant literature as "color spaces") that may be specified for one or more lighting units according to the present disclosure include, but are not limited to, sRGB, Adobe RGB, various television broadcasting color standards (NTSC, SMPTE-C), various printing standards based on CMY(K), Kodak Photo YCC, and others.

For purposes of the following discussion, it is presumed that lighting commands to be adjusted based on the reference color gamut specify prescribed relative amounts of the different source spectrums in a given lighting unit so as to generate a resulting color of light (or color temperature of white light). For example, as discussed above, in one exemplary implementation involving lighting units having red, green and blue sources, a lighting command in the form [R, G, B] may be processed and adjusted by each lighting unit, wherein each of the original R, G, and B values in the received command are specified according to some predetermined scale (zero to some maximum value representing a prescribed maximum output radiant power for each source). In particular, in one implementation as discussed above, lighting commands may specify each of the R, G, and B values as a number varying from 0 to 255 and are processed by a lighting unit according to the DMX protocol (in which eight bits are employed to specify the relative strength of each different source spectrum; i.e., 24-bit color control). It should be appreciated, however, that virtually any scale may be employed, in any of a variety of lighting command formats, to specify the relative amounts of the respective sources in a given lighting unit to generate a resulting color or color temperature of light.

In one embodiment, to determine a transformation for a given lighting unit to adjust lighting commands so that the prescribed source spectrum ratios generate a predictable resulting color in the reference color gamut, the SPD of each different source spectrum in the lighting unit must be known or estimated. If the lighting unit in question formed part of the sample space from which the reference color gamut was derived, then presumably these SPDs already are known (e.g., via measurement or estimation). Otherwise, if the lighting unit in question does not form part of the sample space from which the reference color gamut was derived, the SPDs may be measured or estimated for the lighting unit in question (e.g., in any of the various manners discussed above). In one implementation, one or more lighting units may store representations of their own "SPD set" (i.e., an SPD for each of their different source spectrums) in memory (e.g., the memory 114 shown in FIG. 6). Based on the exemplary lighting units discussed above in connection with FIGS. 9-11, each such lighting unit accordingly may optionally store its own red SPD, green SPD and blue SPD as an "SPD set."

Once an SPD set for a lighting unit is known, in one embodiment a transformation for the lighting unit may be derived based on mapping CIE x,y chromaticity points corresponding to each SPD of the SPD set to a point on the perimeter of the specified reference color gamut. For a given SPD of the SPD set, conceptually this may be achieved by adding some portion of one or more of the other SPDs of the set to shift the given SPD based on additive mixing. While not generally a requirement according to various embodiments discussed herein, in one aspect of the present embodiment one or more SPDs of the SPD set may be mapped to a closest point on the perimeter of the reference color gamut. This situation is exemplified in the particular embodiment discussed above in connection with FIG. 11.

For example, with reference again to FIG. 11, assuming for the moment that one of the points in the red point cloud 90R corresponds to the red SPD of the lighting unit in question, a first partial transformation may be derived to map this point in the red point cloud to the vertex 95R of the reference color gamut 95-2. To accomplish such a mapping for the red SPD of the lighting unit in question, some amount of green and/or blue light, however minimal, may be added to the generated red spectrum to move the resulting adjusted SPD to the point 95R. Similarly, assuming for the moment that one of the points in the green point cloud 90G corresponds to the green SPD of the lighting unit in question, a second partial transformation may be derived to map this point in the green point cloud to the vertex 95G of the reference color gamut 95-2. To accomplish such a mapping for the green SPD of the lighting unit in question, some amount of red and/or blue light, however minimal, may be added to the generated green spectrum to move the resulting adjusted SPD to the point 95G. Likewise, assuming for the moment that one of the points in the blue point cloud 90B corresponds to the blue SPD of the lighting unit in question, a third partial transformation may be derived to map this point in the blue point cloud to the vertex 95B of the reference color gamut 95-2. To accomplish such a mapping for the blue SPD of the lighting unit in question, some amount of red and/or green light, however minimal, may be added to the generated blue spectrum to move the resulting adjusted SPD to the point 95B.

In view of the foregoing, the transformation for the lighting unit may be specified initially as a matrix of correction values $C_{j,k}$ that are mathematically derived to map a lighting command (e.g., specifying a prescribed R-G-B ratio representing a desired color or color temperature) to an adjusted lighting command based on the reference color gamut, according to:

$$\begin{bmatrix} C_{R,R} & C_{G,R} & C_{B,R} \\ C_{R,G} & C_{G,G} & C_{B,G} \\ C_{R,B} & C_{G,B} & C_{B,B} \end{bmatrix} \begin{bmatrix} R \\ G \\ B \end{bmatrix} = \begin{bmatrix} R' \\ G' \\ B' \end{bmatrix}. \quad (2)$$

In Eq. (2), the R-G-B column vector represents the "original" lighting command of prescribed ratios. The R'-G'-B' column vector represents the adjusted lighting command, which provides values indicating actual relative amounts of the respective source spectrums to be generated by the lighting unit, so as to generate light having a predictable color (or color temperature) in the reference color gamut.

For the correction values $C_{j,k}$ in the transformation matrix of Eq. (2), the index j specifies the "original" source spectrum, and the index k specifies a source spectrum that may be needed, in some proportion, to map the original source spectrum to the reference color gamut. For example, with reference again to FIG. 11, consider the leftmost column of the matrix in Eq. (2), which represents the first partial transformation to map a point from the red point cloud 90R to the vertex 95R of the reference color gamut. If in the original lighting command R is set to some non-zero value and both G and B are set to zero (i.e., thereby prescribing some amount of only red light output), the resulting adjusted lighting command is given by:

$$\begin{bmatrix} R' \\ G' \\ B' \end{bmatrix} = \begin{bmatrix} R \cdot C_{R,R} \\ R \cdot C_{R,G} \\ R \cdot C_{R,B} \end{bmatrix}. \quad (3)$$

From Eq. (3), it is clear that although the original lighting command did not prescribe any green or blue light, the adjusted lighting command may specify some amount of green light ($R \cdot C_{R,G}$) and/or some amount of blue light ($R \cdot C_{R,B}$) via the correction values in the transformation matrix. The foregoing analysis applies similarly with respect to the second partial transformation for the green point (given by the second column of the transformation matrix), and the third partial transformation for the blue point (given by the third column of the transformation matrix).

From Eqs. (2) and (3), it may also be appreciated that the diagonal elements of the transformation matrix, namely $C_{R,R}$, $C_{G,G}$, and $C_{B,B}$, essentially represent output radiant power "calibration values" for each of the red, green and blue light in a given exemplary lighting unit, in principle similar to those discussed above in connection with FIG. 6. In particular, a transformation that applied to a lighting command a matrix including only these diagonal elements, according to:

$$\begin{bmatrix} C_{R,R} & 0 & 0 \\ 0 & C_{G,G} & 0 \\ 0 & 0 & C_{B,B} \end{bmatrix} \begin{bmatrix} R \\ G \\ B \end{bmatrix} = \begin{bmatrix} R' \\ G' \\ B' \end{bmatrix} \quad (4)$$

would provide an adjusted lighting command wherein only a scaling factor is applied individually to each of the R, G, and B values for a given lighting unit. Such a transformation according to Eq. (4) may be useful for some applications (e.g., to provide a so-called "calibrated color" for a single lighting unit, and/or ensure that a maximum output radiant power for a given source spectrum is essentially equivalent across multiple lighting units, as discussed above in connection with FIG. 6). However, the transformation matrix in Eq. (4) does not provide any mapping that takes into consideration a reference color gamut common to multiple lighting units of some sample space; accordingly, it does not necessarily guarantee that the respective colors of light generated by a same combination of source spectrums in different lighting units will be perceivably the same.

According to another embodiment, a refinement to the transformation given above in Eq. (2) may be made to adjust the "white point" of the lighting unit. In one aspect of this embodiment, the white point of a lighting unit refers to the CIE chromaticity coordinates corresponding to the light generated by the lighting unit when each of its different source spectrums (e.g., each of the red, green and blue light) is generated at maximum output radiant power. Often, the white point also is described in terms of its color temperature on the white light/black body curve. In some cases, a lighting unit may be purposefully designed to achieve a target white point which, in some cases (but not necessarily all cases), may correspond to the achromatic point E indicated in FIGS. 1-5 and FIG. 11 (i.e., approximately 5500 degrees K).

For purposes of illustrating the concept of white point adjustment, it is presumed that a lighting unit, prior to any transformation of lighting commands, has a target white point corresponding to the achromatic point E indicated on FIG. 11. In some instances, once a transformation is specified for a lighting unit in a manner similar to that discussed above in connection with Eq. (2) and applied to a lighting command prescribing full output for each source spectrum (and hence, specifying light intended to meet the target white point), the lighting unit may in fact provide a light output that is different from the target white point. Such a situation is illustrated conceptually in FIG. 11 by the point 98. Mathematically speaking, the point 98 can be determined by considering the vertices 95R, 95G, and 95B of the reference color gamut 95-2 as virtual light sources that generate light in equal amounts. Alternatively, an SPD of the light generated by the lighting unit, based on the transformation of Eq. (2) applied to a lighting command prescribing full output for each source spectrum, may be measured and CIE x,y chromaticity coordinates calculated for the resulting SPD to determine the point 98.

In one embodiment, to provide a white point adjustment to the transformation matrix given in Eq. (2) so that the point 98 coincides with the target white point (given by the achromatic point E in this example), a constant multiple may be applied to one or more columns of the transformation matrix (e.g., some coefficient that multiplies each of the elements of a given column identically). Conceptually, again considering the vertices 95R, 95G and 95B of the reference color gamut 95-2 shown in FIG. 11 as virtual light sources, this procedure has the effect of scaling the amount of the relative contributions of the vertices so that the target white point is achieved when the transformation matrix is applied to a lighting command. Accordingly, an overall transformation for a lighting unit may be derived iteratively to map received lighting commands to adjusted lighting commands based on a reference color gamut, while at the same time preserving a target white point for the lighting unit.

In another embodiment, a transformation matrix optionally may be further modified to maximize the total possible output of a lighting unit based on adjusted lighting commands. In some instances, once a transformation matrix is derived based on the reference color gamut, and further adjusted for a desired target white point, it may be observed that none of the rows of the transformation matrix adds up to one. Such a matrix operating on a lighting command provides an adjusted lighting command representing a total light output that may be significantly less than originally prescribed. While the benefits of predictable color reproduction based on the reference color gamut may in many cases outweigh a sacrifice of light output, in some applications it may be preferable to mitigate the reduction in light output due to the application of the transformation matrix. Hence, in one embodiment, the row of the transformation matrix with the highest sum may be multiplied by some factor that causes the sum of the row to equal one; subsequently, the remaining two rows similarly may be multiplied by the same factor.

In one exemplary implementation, a transformation for a given lighting unit may be derived a priori according to various embodiments of the present disclosure, based on a previous specification of the reference color gamut as discussed above (see block 84 of FIG. 8), or a specification of a reference color gamut based on some predetermined industry-standard (e.g., the sRGB color space or others), and an evaluation of the lighting fixture (e.g., measurement or estimation of its SPDs). The transformation then may be stored at some point in time (e.g., during a manufacturing/quality assessment process) in the memory of the lighting unit. Thereafter, the lighting unit may be configured to process incoming lighting commands based on the transformation to provide an adjusted lighting command that ultimately dictates the actual color or color temperature of light generated by the lighting unit, based on the reference color gamut. In one aspect of this implementation, the lighting unit may be configured to selectively apply the transformation to incoming lighting commands based on a variety of criteria including, but not limited to, a user interface setting, a network command or instruction, or a sensed signal (e.g., from a signal source 124 shown in FIG. 6), for example.

In another implementation, a lighting unit may be evaluated at some point in time (e.g., during a manufacturing/quality assessment process) and be configured to store its own "SPD set" in memory, as discussed above. At some later time, a representation of a desired reference color gamut may be downloaded to the lighting unit (e.g., via the network configuration shown in FIG. 7). Based on the various concepts discussed herein, the lighting unit then may be instructed to derive a suitable transformation based on its stored SPDs and the downloaded reference color gamut, so as to map received lighting commands to adjusted lighting commands. In this manner, a given lighting unit may be configured "on the fly" at any time to provide variable color light or variable color temperature white light based on any of a variety of reference color gamuts, including those determined according to the concepts disclosed herein as well as predetermined (e.g., industry-specified) color gamuts. As above, in one aspect of this implementation, the lighting unit further may be configured to selectively apply the transformation to received lighting commands based on a variety of criteria including, but not limited to, a user interface setting, a network command or instruction, or a sensed signal (e.g., from a signal source 124 shown in FIG. 6), for example.

While the foregoing discussion in connection with FIGS. 9-11 used the example of a reference color gamut based on red, green and blue LED sources in multiple lighting units, it should be appreciated that the present disclosure is not limited in this respect. Rather, according to various embodiments, a reference color gamut may be derived and specified for a sample space of multiple lighting units each having any number and variety of different source spectrums. For example, as discussed above in connection with FIG. 6 and 12, lighting units 100 may include LEDs having a variety of dominant wavelengths and spectrums (e.g., in addition to, or instead of red LEDs, green LEDs, and blue LEDs, lighting units may employ one or more of cyan LEDs, amber LEDs, yellow LEDs, orange LEDs, and white LEDs of various color temperatures, to name a few).

For example, in another exemplary lighting unit configured to generate primarily white light having a variable color temperature, three or more different LED types may be employed, wherein a first LED type includes one or more white LEDs having a first color temperature, a second LED type includes one or more white LEDs having a second different color temperature, and a third LED type includes one or more "monochromatic" LEDs (e.g., yellow or amber). A reference color gamut according to various embodiments of the present disclosure may be derived and utilized to generate predictable color temperatures of white light in multiple such fixtures, based on the respective SPDs of at least the three (or more) different LED-types obtained from a sample space of such lighting units.

Accordingly, pursuant to the concepts discussed above, in a given lighting unit any three or more different-spectrum LED sources can be mapped to three or more corresponding chromaticity points of the CIE diagram to form a triangle or other polygon defining a gamut for that lighting unit, wherein at least some or all of the different chromaticity points serve as respective vertices of the polygon. As discussed above in connection with FIGS. 9-12, if CIE chromaticity coordinates are plotted for multiple such lighting units, the plotted points generally form multiple point clouds on the CIE diagram, wherein the number of point clouds corresponds to the number of different-spectrum LED sources employed in the lighting units. Thus, while the concepts presented above in connection with FIGS. 9-11 were discussed in terms of three different spectrum LED sources employed in the lighting units, it should be appreciated that these concepts more generally apply to any number of different spectrum LED sources employed in the lighting units.

Likewise, it should be appreciated that according to yet another embodiment of the present disclosure, a reference color gamut may be determined for multiple lighting units based on a "one dimensional" color space (as opposed to the two or more dimensional color spaces represented by the CIE color system and other conventionally defined color spaces). For example, in one embodiment, a reference color gamut may be determined or specified in terms of a one dimensional "color temperature space." In this embodiment, multiple lighting units forming the sample space each include only two different types of white LEDs, i.e., a first LED type including one or more white LEDs having a first color temperature (serving as a first source spectrum), and a second LED type including one or more white LEDs having a second different color temperature (serving as a second source spectrum).

Figure 13:
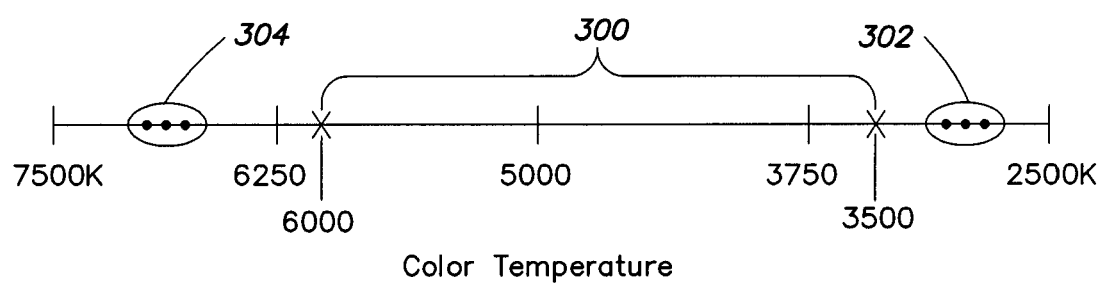
FIG. 13 illustrates a one dimensional color space and a determination/specification of a reference color gamut on such a color space, according to one embodiment of the disclosure.

FIG. 13 illustrates such a one dimensional color temperature space according to one embodiment of the present disclosure. For purposes of an illustrative example, an approximate range of possible color temperatures for the first LED type in each lighting unit of a sample space of such lighting units is taken as from 2900 degrees K to 3300 degrees K (representing relatively "warm" color temperatures), and an approximate range of possible color temperatures for the second LED type in each lighting unit of the sample space is taken as from 6300 degrees K to 7000 degrees K (representing relatively "cool" color temperatures). In one aspect of this embodiment, a color temperature for each of the first LED type and second LED type of each lighting unit is plotted on the one dimensional color temperature space shown in FIG. 13. Each of these color temperatures may correspond to a measured color temperature or estimated color temperature (e.g., based on manufacturer specifications), and ultimately represents a measured or estimated SPD for a given LED source. As discussed above, in another aspect, one or more SPDs of the LED sources in the lighting units of this embodiment also may be modeled for any possible effects of one or more intervening surfaces between the actual output of a given source spectrum and an observation point at which light actually is perceived.

Consider a sample space of three lighting units, each including the first LED type and the second LED type discussed above. In FIG. 13, the color temperatures corresponding to each of the first LED types are plotted and form the point cloud 302. Likewise, the color temperatures corresponding to each of the second LED types are plotted and form the point cloud 304. As discussed above in connection with other (multidimensional) color spaces, according to one embodiment a reference color gamut may be specified in the color temperature color space illustrated in FIG. 13 such that any color temperature that is included in the reference color gamut can be generated by any lighting unit in the sample space. One such exemplary reference color gamut is indicated in FIG. 13 by the gamut 300, ranging from 3500 degrees K to 6000 degrees K. Specifically, any combination of first and second LED types from the sample space that may appear in any lighting unit would be capable of generating white light having a color temperature within the reference color gamut 300.

In the embodiment of FIG. 13, for a given lighting unit, a transformation may be derived in a manner similar to that discussed above such that a lighting command may be mapped to an adjusted lighting command based on the reference color gamut 300 in the color temperature color space. For example, consider lighting commands in the format [W1, W2], specifying a prescribed ratio of the first source spectrum (first LED type) and the second source spectrum. A matrix transformation may be derived according to:

$$\begin{bmatrix} C_{W1,W1} & C_{W2,W1} \\ C_{W1,W2} & C_{W2,W2} \end{bmatrix} \begin{bmatrix} W1 \\ W2 \end{bmatrix} = \begin{bmatrix} W1' \\ W2' \end{bmatrix} \quad (5)$$

wherein the column vector of values W1' and W2' represents an adjusted lighting command. From Eq. (5), it may be appreciated that the matrix transformation effects the appropriate mapping by adding some amount of one of the source spectrums to the other of the source spectrums so as to move incoming lighting commands into the reference color gamut 300.

While the discussion in connection with FIGS. 9-13 focused on LED sources, it should be appreciated that the concepts discussed herein apply more generally to virtually any type of light source. Furthermore, according to other embodiments of the present disclosure, color models, color systems or color spaces other than the CIE color system and CIE x,y chromaticity diagram may be employed (e.g., as illustrated by the color temperature color space of FIG. 13) for deriving and specifying a variety of possible reference color gamuts pursuant to the concepts disclosed herein. For example, in a manner similar to that discussed above in connection with Eqs. (2) and (5) above, one or more transformations may be derived to provide adjustments to any arbitrary lighting command based on a reference color gamut as specified within the construct of virtually any color space/model/system, according to the various concepts discussed herein, to provide for the consistent and predictable generation of colored light or white light.

Having thus described several illustrative embodiments, it is to be appreciated that various alterations, modifications, and improvements will readily occur to those skilled in the art. Such alterations, modifications, and improvements are intended to be part of this disclosure, and are intended to be within the spirit and scope of this disclosure. While some examples presented herein involve specific combinations of functions or structural elements, it should be understood that those functions and elements may be combined in other ways according to the present invention to accomplish the same or different objectives. In particular, acts, elements, and features discussed in connection with one embodiment are not intended to be excluded from similar or other roles in other embodiments. Accordingly, the foregoing description and attached drawings are by way of example only, and are not intended to be limiting.

The invention claimed is:

1. A method for specifying a reference color gamut for a plurality of lighting units, the reference color gamut defining an essentially identical range of colors or color temperatures that may be generated by each of the plurality of lighting units, each lighting unit configured to generate multiple colors or color temperatures of light based on an additive mixing of at least first light having a first spectrum and second light having a second spectrum, wherein the first and second spectrums are different, the method comprising acts of:

representing a plurality of spectral power distributions (SPDs) on a color space, the plurality of SPDs including at least one spectral power distribution (SPD) for each of at least the first light and the second light generated by each of the plurality of lighting units; and specifying the reference color gamut in the color space, such that any color that is included in the reference color gamut can be generated by any lighting unit of the plurality of lighting units, wherein each lighting unit is configured to generate the multiple colors or color temperatures of the light based on an additive mixing of at least the first light, the second light, and third light having a third spectrum different from the first and second spectrums, and wherein:

the act of representing includes an act of:
A) representing the plurality of spectral power distributions (SPDs) on the color space, the plurality of SPDs including at least one spectral power distribution (SPD) for each of at least the first light, the second light and the third light generated by each of the plurality of lighting units; and the act of specifying includes an act of:
B) specifying the reference color gamut in the color space, based on the act A), such that any color that is included in the reference color gamut can be generated by any lighting unit of the plurality of lighting units, wherein the color space includes a CIE color system, and wherein the act A) comprises an act of:
A1) mapping each SPD of the plurality of SPDs to a corresponding point on a CIE chromaticity diagram to provide a plurality of points, wherein the act B) comprises acts of:
B1) determining a largest polygon formed on the CIE chromaticity diagram by connecting at least some of the plurality of points by a straight line, each vertex of the largest polygon corresponding to one SPD associated with a different one of the at least first, second and third lights; and
B2) specifying the reference color gamut as at least one region smaller than and within the largest polygon.

2. The method of claim 1, wherein at least one of the at least first, second and third spectrums has a full width at half maximum (FWHM) of approximately 20 nanometers or less.

3. The method of claim 2, wherein each of the at least first, second and third spectrums has a full width at half maximum (FWHM) of approximately 20 nanometers or less.

4. The method of claim 1, wherein at least one of the at least first, second and third spectrums represents essentially white light substantially corresponding to a particular color temperature.

5. The method of claim 4, wherein at least two of the at least first, second and third spectrums represent essentially white light substantially corresponding to respectively different color temperatures.

6. The method of claim 5, wherein at least one of the at least first, second and third spectrums has a full width at half maximum (FWHM) of approximately 20 nanometers or less.

7. The method of claim 1, further comprising an act of:
measuring the at least one SPD for each of at least the first light, the second light and the third light generated by each of the plurality of lighting units to provide the plurality of spectral power distributions (SPDs).

8. The method of claim 1, further comprising an act of:
estimating the at least one SPD for each of at least the first light, the second light and the third light generated by each of the plurality of lighting units to provide the plurality of spectral power distributions (SPDs).

9. The method of claim 1, wherein the at least first, second and third lights include at least four lights having respective different spectrums, wherein the plurality of SPDs includes at least one SPD for each of the at least four lights generated by each of the plurality of lighting units, and wherein the act B1) comprises acts of:
determining the largest polygon formed on the CIE chromaticity diagram by connecting the at least some of the plurality of points, each vertex of the largest polygon corresponding to one SPD associated with a different one of the at least four lights.

10. The method of claim 1, wherein the act B2) comprises an act of:
specifying the reference color gamut as a smaller polygon, wherein the largest polygon and the reference color gamut have a same number of vertices.

11. The method of claim 1, wherein the act B2) comprises an act of:
specifying the reference color gamut as a smaller polygon, wherein the largest polygon and the reference color gamut have a different number of vertices.

12. The method of claim 1, wherein the act B2) comprises an act of:
specifying the reference color gamut as at least one arbitrarily shaped region.

13. The method of claim 1, wherein the act B2) comprises an act of:
specifying the reference color gamut such that the at least one region has a perimeter including at least one curved portion.

14. The method of claim 1, wherein the act B2) comprises an act of:
specifying the reference color gamut as at least one first region smaller than and within the largest polygon, wherein the at least one first region surrounds a second region that is completely enclosed by the at least one first region but not included in the reference color gamut.

15. The method of claim 1, wherein the act B2) comprises an act of:
mathematically defining the reference color gamut.

16. The method of claim 1, further comprising an act of:
D) specifying an overall transformation for at least a first lighting unit of the plurality of lighting units to adjust a lighting command based on the reference color gamut so as to provide an adjusted lighting command, the lighting command specifying prescribed relative amounts of at least the first light, the second light, and the third light to be generated by the first lighting unit and the adjusted lighting command specifying actual relative amounts of at least the first light, the second light, and the third light to be generated by the first lighting unit.

17. The method of claim 16, wherein the act D) comprises acts of:
D1) deriving a first partial transformation to map a first point on the CIE chromaticity diagram corresponding to a first SPD for the first light from the first lighting unit to a perimeter of the reference color gamut;
D2) deriving a second partial transformation to map a second point on the CIE chromaticity diagram corresponding to a second SPD for the second light from the first lighting unit to the perimeter of the reference color gamut;
D3) deriving a third partial transformation to map a third point on the CIE chromaticity diagram corresponding to a third SPD for the third light from the first lighting unit to the perimeter of the reference color gamut; and
D4) combining the first, second and third partial transformations to provide the overall transformation.

18. The method of claim 17, wherein:
the act D1) comprises an act of deriving the first partial transformation to map the first point to a first corresponding closest point on the perimeter of the reference color gamut;
the act D2) comprises an act of deriving the second partial transformation to map the second point to a second corresponding closest point on the perimeter of the reference color gamut; and
the act D3) comprises an act of deriving the third partial transformation to map the third point to a third corresponding closest point on the perimeter of the reference color gamut.

19. The method of claim 17, further comprising an act of:
E) scaling at least one of the first partial transformation, the second partial transformation, and the third partial transformation, prior to the act D4), to provide a white point adjustment in the overall transformation.

20. The method of claim 19, wherein the act E) comprises an act of:
determining the white point adjustment such that a resulting color of light from the first lighting fixture when the lighting command prescribes a maximum output for each of at least the first light, the second light, and the third light, has an SPD that corresponds approximately to an achromatic white point on the CIE chromaticity diagram.

21. The method of claim 16, further comprising an act of:
scaling the overall transformation such that the lighting unit provides a maximum output for at least one of the first light, the second light and the third light when the lighting command prescribes the maximum output for the at least one of the first light, the second light and the third light.

22. A method for specifying a reference color gamut for a plurality of lighting units, the reference color gamut defining an essentially identical range of colors or color temperatures that may be generated by each of the plurality of lighting units, each lighting unit configured to generate multiple colors or color temperatures of light based on an additive mixing of at least first light having a first spectrum and second light having a second spectrum, wherein the first and second spectrums are different, the method comprising acts of:

representing a plurality of spectral power distributions (SPDs) on a color space, the plurality of SPDs including at least one spectral power distribution (SPD) for each of at least the first light and the second light generated by each of the plurality of lighting units; and specifying the reference color gamut in the color space, such that any color that is included in the reference color gamut can be generated by any lighting unit of the plurality of lighting units, wherein each lighting unit is configured to generate the multiple colors or color temperatures of the light based on an additive mixing of at least the first light, the second light, and third light having a third spectrum different from the first and second spectrums, and wherein:

the act of representing includes an act of:
A) representing the plurality of spectral power distributions (SPDs) on the color space, the plurality of SPDs including at least one spectral power distribution (SPD) for each of at least the first light, the second light and the third light generated by each of the plurality of lighting units; and the act of specifying includes an act of:
B) specifying the reference color gamut in the color space, based on the act A), such that any color that is included in the reference color gamut can be generated by any lighting unit of the plurality of lighting units, wherein the color space includes a CIE color system, and wherein the act A) comprises an act of:

A1) mapping each SPD of the plurality of SPDs to a corresponding point on a CIE chromaticity diagram to provide a plurality of points, wherein the plurality of SPDs comprises at least:

a first set of SPDs, each SPD of the first set corresponding to the first light generated by a different one of the plurality of lighting units, such that the first set of SPDs represents all of the first lights from all of the plurality of lighting units;

a second set of SPDs, each SPD of the second set corresponding to the second light generated by a different one of the plurality of lighting units, such that the second set of SPDs represents all of the second lights from all of the plurality of lighting units; and a third set of SPDs, each SPD of the third set corresponding to the third light generated by a different one of the plurality of lighting units, such that the third set of SPDs represents all of the third lights from all of the plurality of lighting units, and wherein the act A1) comprises acts of:
mapping the first set of SPDs to the CIE chromaticity diagram to form a first point cloud;
mapping the second set of SPDs to the CIE chromaticity diagram to form a second point cloud; and
mapping the third set of SPDs to the CIE chromaticity diagram to form a third point cloud, wherein the act B) comprises an act of:
connecting each point in each point cloud to all other points in two neighboring point clouds via a plurality of straight lines; and
specifying the reference color gamut as a largest enclosed region of the CIE chromaticity diagram not bisected by any of the plurality of straight lines and having a perimeter delineated by at least some of the plurality of straight lines.

23. An apparatus, comprising:
at least one first LED configured to generate first light having a first spectrum;
at least one second LED configured to generate second light having a second spectrum different from the first spectrum; and
at least one controller configured to control the first and second light based at least in part on a reference color gamut that establishes a range of colors or color temperatures of perceived light that can be generated by the apparatus,
wherein the at least one controller is configured to adjust a lighting command based on the reference color gamut so as to provide an adjusted lighting command, the lighting command specifying prescribed relative amounts of at least the first light and the second light to be generated by the apparatus and the adjusted lighting command specifying actual relative amounts of at least the first light and the second light to be generated by the apparatus,
wherein the apparatus further includes at least one third LED configured to generate third light having a third spectrum different from the first and second spectrums, and wherein the lighting command specifies prescribed relative amounts of at least the first light, the second light and the third light to be generated by the apparatus and the adjusted lighting command specifies actual relative amounts of at least the first light, the second light and the third light to be generated by the apparatus,
wherein the reference color gamut is specified according to the method of claim 21, and wherein the apparatus is one lighting unit of the plurality of lighting units, and
wherein the at least one controller is configured to apply an overall transformation to adjust the lighting command based on the reference color gamut so as to provide the adjusted lighting command.

24. The apparatus of claim 23, wherein:
the at least one first LED includes at least one first white LED; and
the at least one second LED includes at least one second white LED.

25. The apparatus of claim 23, wherein the apparatus is configured as an illumination device to provide ambient illumination that includes a single color of the perceived light at a given time.

26. The apparatus of claim 23, wherein the at least one controller receives the overall transformation from an external source.

27. The apparatus of claim 23, wherein the at least one controller includes at least one memory in which the overall transformation is stored.

28. The apparatus of claim 23, wherein the at least one controller is configured to derive the overall transformation.

29. The apparatus of claim 28, wherein the at least one controller receives a representation of the reference color gamut from an external source.

30. The apparatus of claim 28, wherein the at least one controller includes at least one memory in which is stored at least a first spectral power distribution (SPD) for the first light, a second SPD for the second light, and a third SPD for the third light.

31. The apparatus of claim 30, wherein the apparatus includes at least one sensor to measure at least one of the first SPD, the second SPD, and the third SPD.

32. The apparatus of claim 30, wherein the at least one controller is configured to:
derive a first partial transformation to map a first point on the CIE chromaticity diagram corresponding to the first SPD for the first light to a perimeter of the reference color gamut;
derive a second partial transformation to map a second point on the CIE chromaticity diagram corresponding to a second SPD for the second light to the perimeter of the reference color gamut;
derive a third partial transformation to map a third point on the CIE chromaticity diagram corresponding to a third SPD for the third light to the perimeter of the reference color gamut; and
combine the first, second and third partial transformations to provide the overall transformation.

33. The apparatus of claim 32, wherein the at least one controller is further configured to scale at least one of the first partial transformation, the second partial transformation, and the third partial transformation to provide a white point adjustment in the overall transformation.

34. The apparatus of claim 32, wherein the at least one controller is further configured to scaling the overall transformation such that the apparatus provides a maximum output for at least one of the first light, the second light and the third light when the lighting command prescribes the maximum output for the at least one of the first light, the second light and the third light.

35. The method of claim 22, further comprising an act of:
C) specifying an overall transformation for at least a first lighting unit of the plurality of lighting units to adjust a lighting command based on the reference color gamut so as to provide an adjusted lighting command, the lighting command specifying prescribed relative amounts of at least the first light, the second light, and the third light to be generated by the first lighting unit and the adjusted lighting command specifying actual relative amounts of at least the first light, the second light, and the third light to be generated by the first lighting unit.

36. The method of claim 35, wherein the act C) comprises acts of:
C1) deriving a first partial transformation to map a first point on the CIE chromaticity diagram corresponding to a first SPD for the first light from the first lighting unit to a perimeter of the reference color gamut;
C2) deriving a second partial transformation to map a second point on the CIE chromaticity diagram corresponding to a second SPD for the second light from the first lighting unit to the perimeter of the reference color gamut;
C3) deriving a third partial transformation to map a third point on the CIE chromaticity diagram corresponding to a third SPD for the third light from the first lighting unit to the perimeter of the reference color gamut; and
C4) combining the first, second and third partial transformations to provide the overall transformation.

37. The method of claim 36, wherein:
the act C1) comprises an act of deriving the first partial transformation to map the first point to a first corresponding closest point on the perimeter of the reference color gamut;
the act C2) comprises an act of deriving the second partial transformation to map the second point to a second corresponding closest point on the perimeter of the reference color gamut; and
the act C3) comprises an act of deriving the third partial transformation to map the third point to a third corresponding closest point on the perimeter of the reference color gamut.

38. The method of claim 36, further comprising an act of:
D) scaling at least one of the first partial transformation, the second partial transformation, and the third partial transformation, prior to the act C4), to provide a white point adjustment in the overall transformation.

39. The method of claim 38, wherein the act D) comprises an act of:
determining the white point adjustment such that a resulting color of light from the first lighting fixture when the lighting command prescribes a maximum output for each of at least the first light, the second light, and the third light, has an SPD that corresponds approximately to an achromatic white point on the CIE chromaticity diagram.

40. The method of claim 35, further comprising an act of:
scaling the overall transformation such that the lighting unit provides a maximum output for at least one of the first light, the second light and the third light when the lighting command prescribes the maximum output for the at least one of the first light, the second light and the third light.

* * * * *